(12) United States Patent
Wang

(10) Patent No.: US 8,113,436 B2
(45) Date of Patent: Feb. 14, 2012

(54) SEMICONDUCTOR STRUCTURE WITH COMMUNICATION ELEMENT

(75) Inventor: Chih-Hsin Wang, San Jose, CA (US)

(73) Assignee: RFMarq, Inc., Monte Sereno, CA (US)

( * ) Notice: Subject to any disclaimer, the term of this patent is extended or adjusted under 35 U.S.C. 154(b) by 353 days.

(21) Appl. No.: 12/573,485

(22) Filed: Oct. 5, 2009

(65) Prior Publication Data

US 2010/0038763 A1 Feb. 18, 2010

Related U.S. Application Data

(60) Division of application No. 11/157,300, filed on Jun. 20, 2005, now Pat. No. 7,607,586, which is a continuation-in-part of application No. 11/091,647, filed on Mar. 28, 2005, now Pat. No. 7,784,688.

(51) Int. Cl.
*G06K 19/06* (2006.01)
(52) U.S. Cl. ........................................ 235/492; 235/468
(58) Field of Classification Search .................. 235/492, 235/468; 257/678, 684, 690; 361/707, 709
See application file for complete search history.

(56) References Cited

U.S. PATENT DOCUMENTS

| | | | |
|---|---|---|---|
| 5,909,050 A | 6/1999 | Furey et al. | |
| 6,163,299 A | 12/2000 | Park | |
| 6,373,447 B1 | 4/2002 | Rostoker | |
| 6,734,825 B1 | 5/2004 | Guo | |
| 7,045,887 B2 * | 5/2006 | Karnezos | 257/686 |
| 7,179,681 B2 | 2/2007 | Bolken et al. | |
| 7,245,213 B1 | 7/2007 | Esterberg et al. | |
| 7,260,882 B2 | 8/2007 | Credelle et al. | |
| 7,336,270 B2 | 2/2008 | Sato | |
| 7,383,058 B2 | 6/2008 | Franca-Neto | |
| 2002/0171591 A1 * | 11/2002 | Beard | 343/702 |
| 2003/0143971 A1 | 7/2003 | Hongo | |
| 2004/0185682 A1 | 9/2004 | Foulke et al. | |
| 2005/0242957 A1 | 11/2005 | Lindsay et al. | |
| 2006/0109120 A1 | 5/2006 | Burr et al. | |

* cited by examiner

*Primary Examiner* — Ahshik Kim
(74) *Attorney, Agent, or Firm* — Patent Law Group LLP; Carmen C. Cook

(57) ABSTRACT

In one embodiment, a structure includes a semiconductor chip including a communication element for performing a wireless communication function where the communication element has a communication core occupying a region of the semiconductor chip, a plurality of chip pads with two of the chip pads electrically connected to the communication core; a chip carrier for carrying the semiconductor chip where the chip carrier includes a plurality of carrier pads with two of the carrier pads connected to the two chip pads; and an antenna connected to the carrier pads and electrically connected to the chip pads and to the communication core.

20 Claims, 14 Drawing Sheets

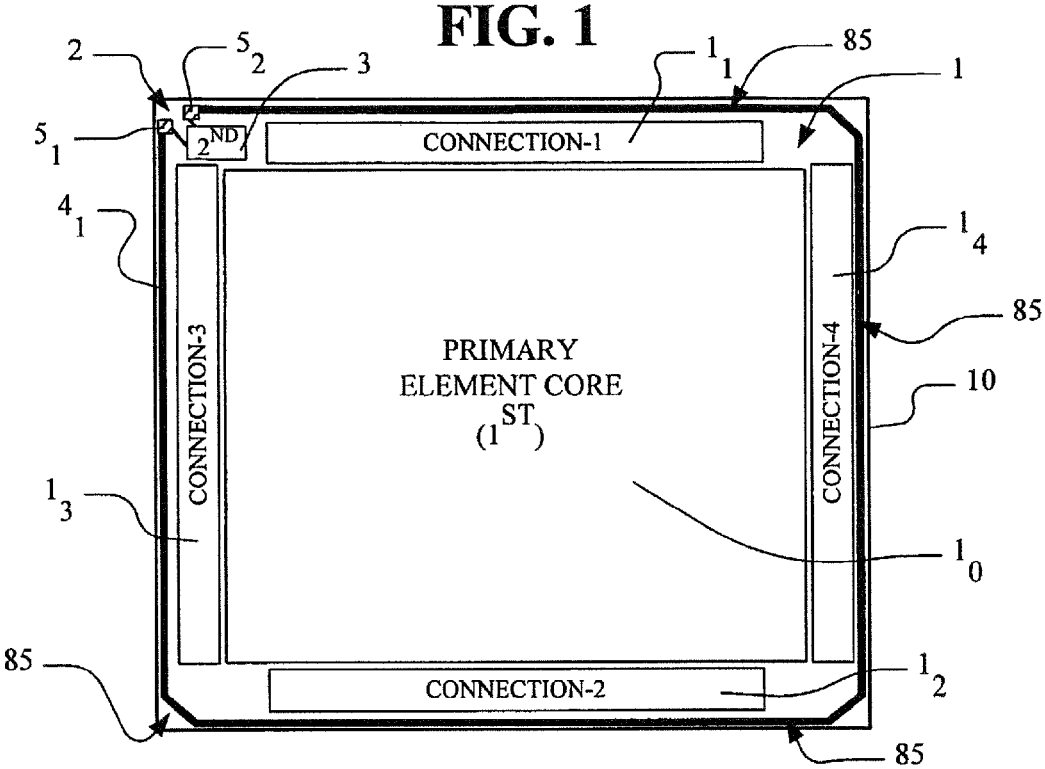
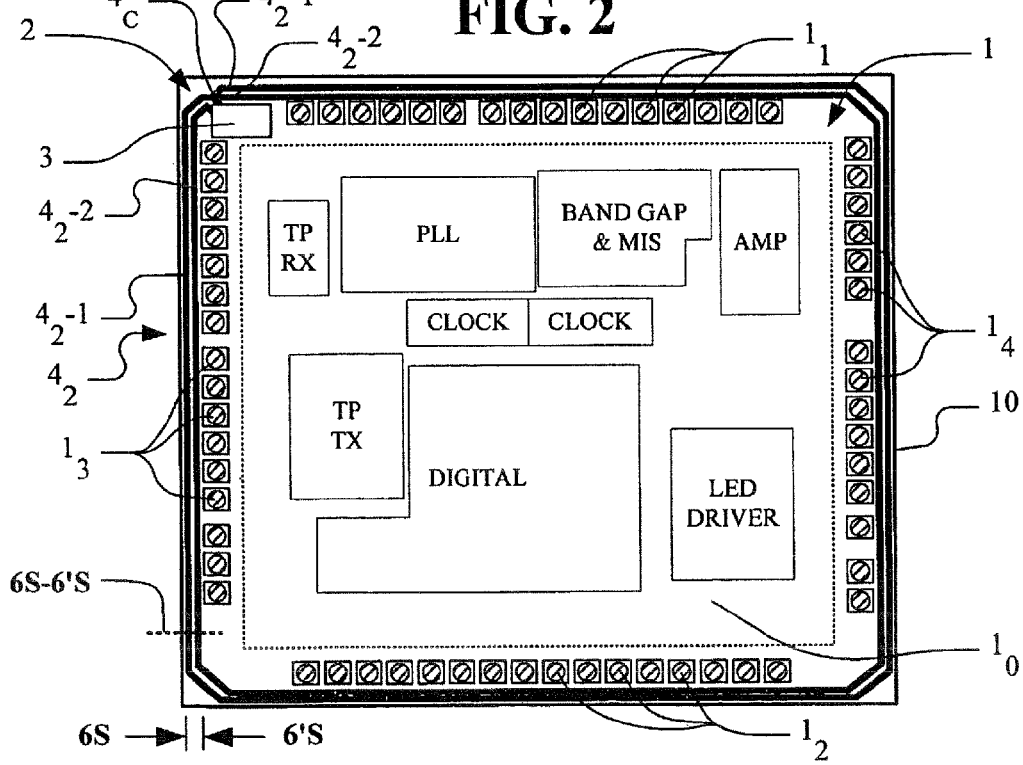

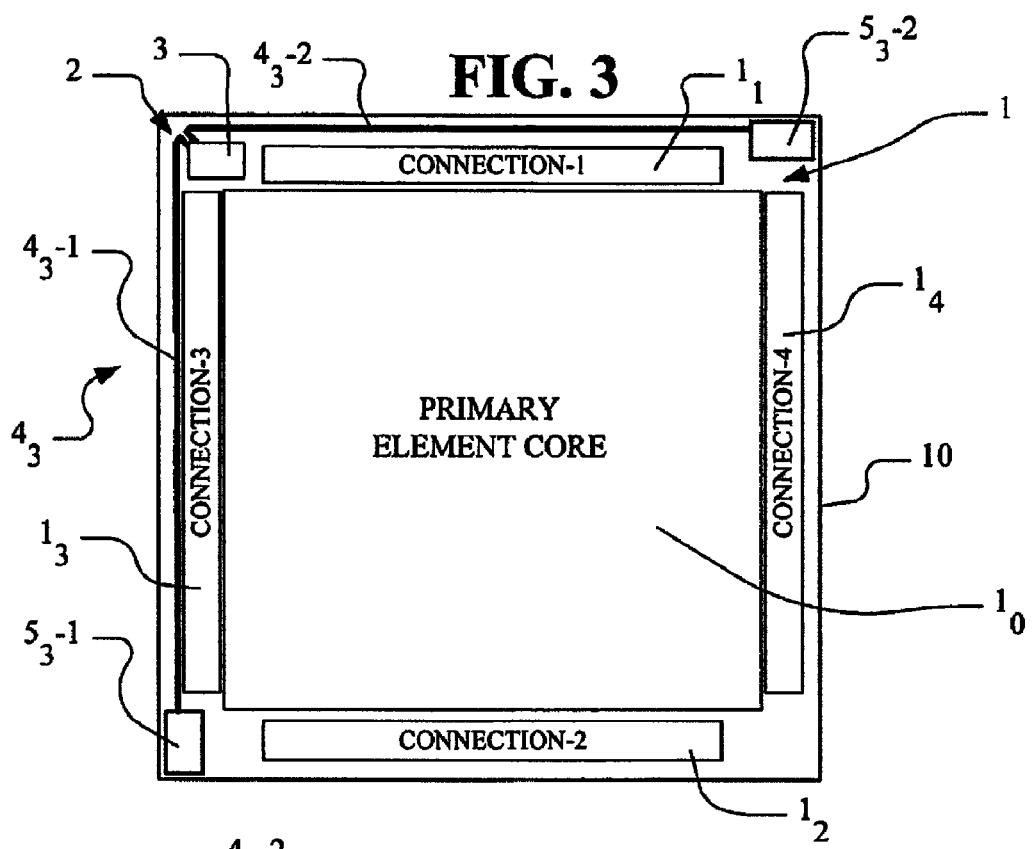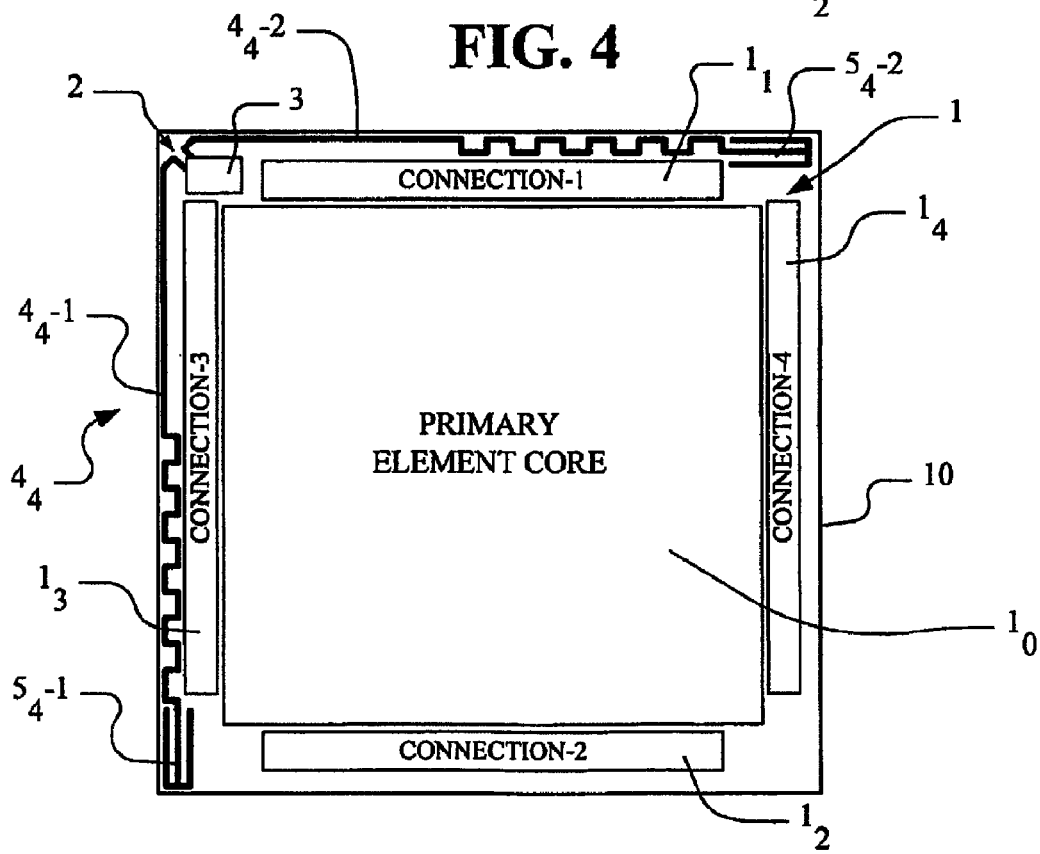

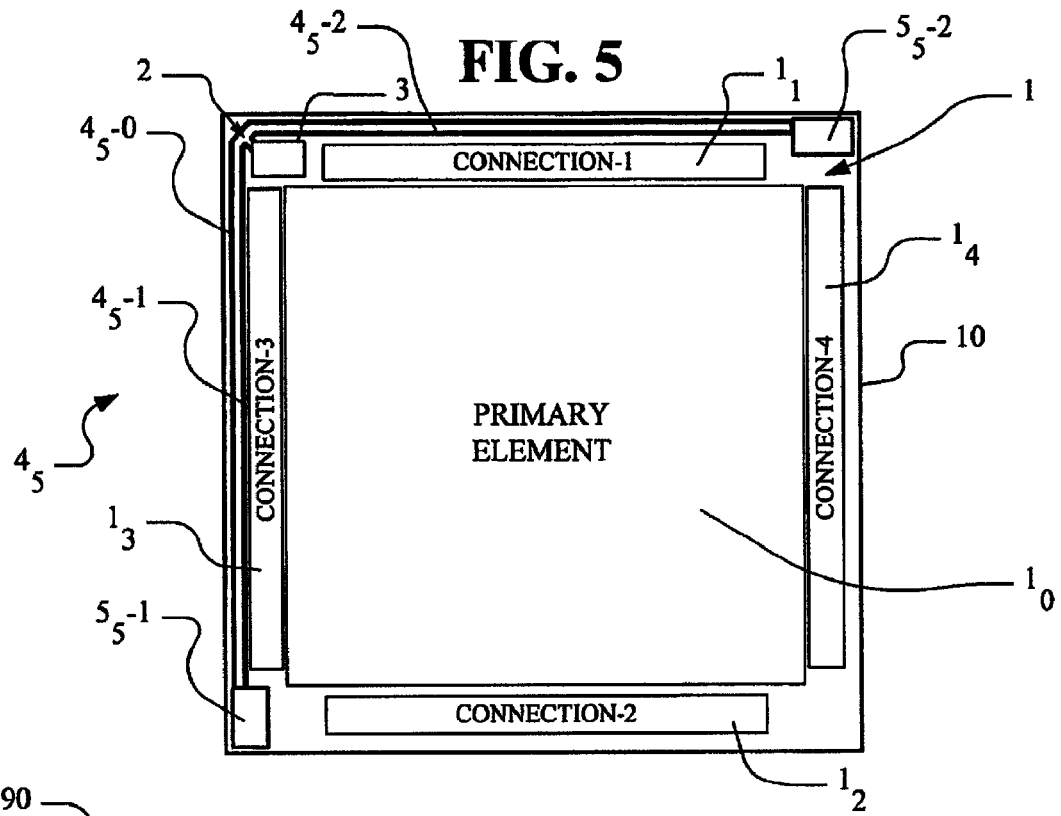
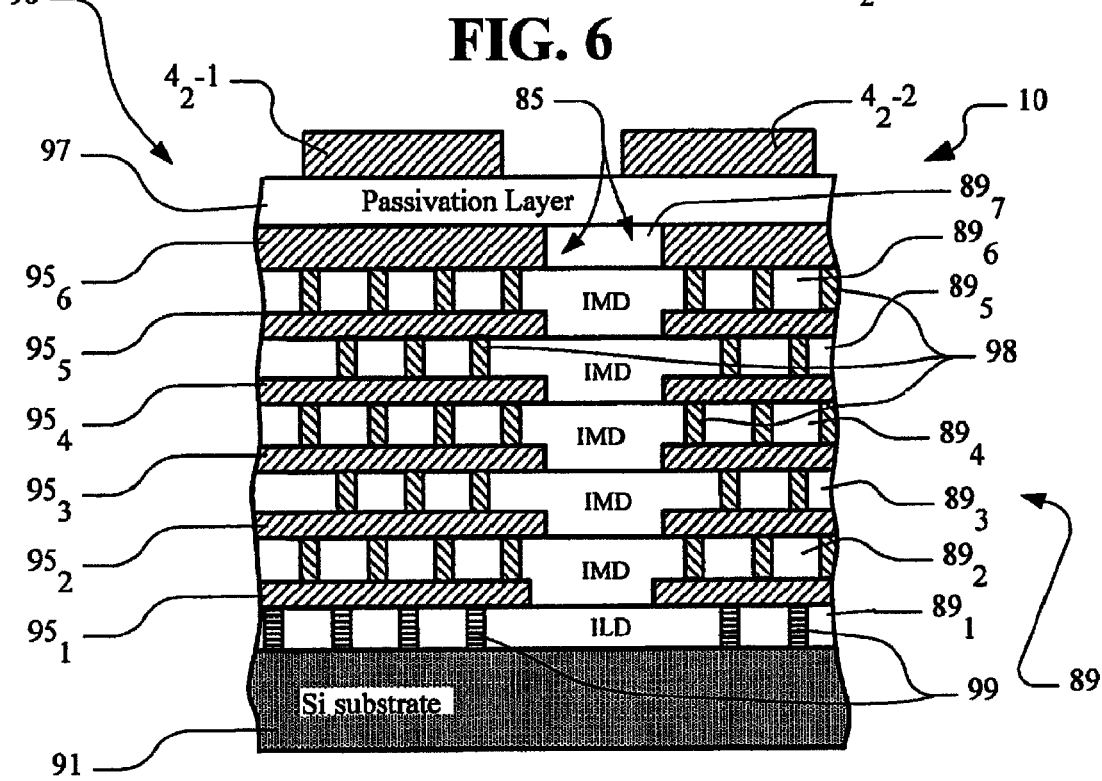

SEMICONDUCTOR STRUCTURE WITH COMMUNICATION ELEMENT

RELATED APPLICATIONS

This application is a Divisional of U.S. patent application Ser. No. 11/157,300, filed Jun. 20, 2005, entitled "SEMICONDUCTOR STRUCTURE WITH RF ELEMENT," now U.S. Pat. No. 7,607,586, issued Oct. 27, 2009, which is a Continuation-In-Part of U.S. patent application Ser. No. 11/091,647, filed on Mar. 28, 2005, now U.S. Pat. No. 7,784,688 entitled "SYSTEM FOR TRACKING ELEMENTS USING TAGS".

TECHNICAL FIELD

The present invention relates to semiconductor structures, and relates more specifically to semiconductor structures that include a semiconductor primary element for performing a primary function and that include a semiconductor secondary element for providing a radio frequency (RF) communication function as a secondary function.

BACKGROUND OF THE INVENTION

Semiconductor structures are formed by sequential processing steps that process wafers where each wafer has many dies. The dies are then packaged to form the packaged semiconductor devices with each die having one or more primary functions.

The processing steps for semiconductor devices use different masks to define the different parts of each device. The mask patterns are usually on a glass or other transparent substrate so that optical, X-ray or other energy sources are imaged through the mask onto a prepared wafer surface. A set of different masks are used in sequential steps of the semiconductor manufacturing processes. The processing of the wafer and each of the dies on a wafer results in dies that have one or more primary functions according to an engineering design. The processing steps performed to create the dies are referred to as the "native" processing steps.

A semiconductor device may have a radio frequency (RF) function as its primary function. In one example, the RF function for a tag for tracking information is the primary function of the semiconductor device that forms the structure of the tag.

A RF communication for an RF function is implemented with an RF element, having an RF transmitter and an RF receiver, as a part of the semiconductor device. For a tag semiconductor device, the RF element typically communicates with an external RF communicator such as a tag reader.

Regardless of the particular function of the RF element, the RF communication requires an antenna. Antennas that are an integral part of a semiconductor device are defined as internal antennas. RF communication with an internal antenna of a semiconductor device is done by having the internal antenna communicating with an antenna of an RF communicator (sometimes called interrogator, reader, or writer) or with an antenna of some other device.

The antenna is a key part of RF communication. In typical RFID (radio frequency identification) systems, an antenna of a RF tag is an element that permits the tag to exchange data with the antenna of an RF communicator. The exchange can occur through inductive magnetic field coupling between the antennas. Many tags in RFID systems operate as passive devices wherein the tag is energized upon the coupling of the tag antenna with the communicator antenna. The response of a tag occurs by changing the load of the magnetic field in the RF tag. For example, some passive RFID tags make use of a coiled tag antenna that creates a magnetic field using the energy provided by the external RF communicator's carrier signal.

For an RFID tag formed as a discrete semiconductor device where RF communication is the primary function of the semiconductor device, the area of tag is very small (typically with a die area in the range of from about 0.5 $mm^2$ to about 0.10 $mm^2$). Antennas internal to such tags ("built-in antennas") that use the native manufacturing processes of the semiconductor device have been small antennas limited in size to the size of the semiconductor device. Such small antennas, however, do not perform adequately because only a short communication range to the reader is possible or because of other RF communication problems inherent in very small antennas.

To achieve a greater range of interaction with an external RF communicator and achieve better antenna performance, RFID tags typically have larger "off-tag" antennas. The off-tag antennas require special manufacturing steps that are different than the native semiconductor processing steps used in manufacturing the tag. Therefore, "off-tag" antennas increase the overall RFID manufacturing cost. While it is desirable to build internal antennas for semiconductor devices using native processing steps, the antennas ultimately must be capable of RF communications that satisfy the RF communication function in a low cost and efficient manner.

The size, structure and designs of antennas are critical to achieving reliable, low cost RF communication functions in semiconductor devices.

In communication devices generally and specifically for semiconductor devices, antennas are elements having the function of transferring radiation energy to (in the receive mode) or from (in the transmit mode) an electronic device. Radiation energy is transferred from an electronic device into space or is transferred from space into the electronic device. A transmitting antenna is a structure that forms a transition between guided waves constrained by the electronic device and space waves traveling in space external to the electronic device. A receiving antenna is a structure that forms a transition between space waves traveling external to the electronic device and guided waves constrained by the electronic device. Often the same antenna operates both to receive and transmit radiation energy.

Frequencies at which antennas radiate are resonant frequencies. A resonant frequency, f, of an antenna can have many different values as a function, for example, of components providing the signal to the antenna, conductors of the antenna, dielectric constants and other electrical properties of materials of the antenna, the type of antenna, the size and other geometry of the antenna and the speed of light.

In general, wavelength, $\lambda$, is given by $\lambda=c/f=cT$ where c=velocity of light ($3\times10^8$ meters/sec), f=frequency (cycles/sec), T=1/f=period (sec). The radiation wavelength, $\lambda$, of an antenna is related to physical dimensions of the antenna. The electrical impedance of an antenna is allocated between a radiation resistance, Rr, and an ohmic resistance, Ro. The higher the ratio of the radiation resistance, Rr, to the ohmic resistance, Ro, the greater the radiation efficiency of the antenna.

A number of different small antenna types are well known and include, for example, loop antennas, small loop antennas, dipole antennas, folded dipole antennas, stub antennas, conical antennas, helical antennas and spiral antennas. Small antennas, including loop antennas, often have the property that radiation resistance, $R_r$, of the antenna decreases sharply when the antenna length is shortened. Small loops and short dipoles typically exhibit radiation patterns of λ/2 and λ/4, respectively. Ohmic losses due to the ohmic resistance, $R_o$ are typically minimized using impedance matching networks. Although impedance matched small loop antennas can exhibit 50% to 85% efficiencies, their bandwidths have been narrow, with very high Q, for example, Q>50. Q is defined for purposes of this specification as follows:

$$Q=\{\text{transmitted or received frequency}\}/\{3 \text{ dB bandwidth}\}.$$

An antenna goes into resonance where the impedance of the antenna is purely resistive and the reactive component is 0. Impedance is a complex number consisting of real resistance and imaginary reactance components. A matching network can be used to force resonance by eliminating the reactive component of impedance for particular frequencies.

By way of one example, a short dipole antenna has an equivalent electrical circuit that is a series RLC connection where the inductance L represents the inductance of the antenna conductors, the capacitor C is the capacitance between the antenna conductors and the resistance R represents the energy of radiation. When the dipole is very short, the circuit is dominated by the capacitive reactance and the radiation resistance with the radiation resistance being very small and the capacitive reactance quite large. As the antenna is made longer, the radiation resistance increases as well as the inductive reactance while the capacitive reactance becomes smaller. When the antenna is approximately one half wavelength long, the capacitive and inductive reactances are equal, they cancel, and the antenna is in resonance. As an antenna becomes longer still, the equivalent circuit transforms into a parallel resonate circuit of R, L and C values. The resonance point is reached when the antenna is about one wavelength long and the radiation resistance becomes very high. When the antenna approaches one and one half wavelengths it again looks like a series RLC circuit and at two wavelengths it is back to the parallel circuit, This impedance pattern repeats in increments of one wavelength in length.

Internal antenna designs have included Microstrip Antennas, Patch Antennas, Planar Inverted-F Antennas (PIFA) and Meander Line Antennas (MLA).

Microstrip Antennas are similar to monopole antennas, except Microstrip Antennas are positioned on a two-dimensional surface such as a circuit board internal to a wireless device. Usually Microstrip Antennas are designed based upon ½-wavelength, λ/2, or ¼-wavelength, λ/4, conductor geometry. Although such antennas are inexpensive, they suffer in radiation inefficiency due to surrounding metallic and other sections. Microstrip Antennas are usually limited in bandwidth to narrow, single-frequency band applications.

Patch Antennas are typically fabricated out of a square or round conductive plate mounted parallel to and offset over a ground plane. In a typical example, the dimension of the square plate is precisely ½-wavelength, λ/2. The resulting radiation pattern is normal to the surface of the ground plane (typically the circuit board of a device), resulting in a directional "mushroom" or "inverted cone" pattern that tends to be narrow in bandwidth. Such antennas are typically used in single frequency applications requiring a directed beam pattern, such as a wall-mounted or reader access point.

PIFA Antennas are in the shape of a letter "F" lying on its side with the top mounted parallel to and offset over a ground plane, with the two shorter sections mounted perpendicular to the top to provide feed and ground points and with the 'tail' providing the radiating surface. PIFA antennas exhibit omni directional patterns and can radiate in more than one frequency band, but their efficiencies are not good and they are difficult to design.

Meander Line Antennas (MLA) are a combination of a loop antenna and a frequency-tuning meander line. The electrical length of the MLA is made up principally by the delay characteristic of the meander line rather than the length of the radiating structure itself. MLAs can exhibit broadband capabilities for operation on several frequency bands.

While many different types of antennas are known, the embedding of internal antennas in semiconductor structures using native processing provides special challenges in order to achieve satisfactory radiation and other antenna performance without interfering with the semiconductor structures utilized for the primary function.

The area of discrete RF element (e.g. a tag) is typically very small (typically of an area in the range of about 0.1 $mm^2$ to about 0.50 $mm^2$). An antenna internal to such a tag or device supporting RF communication therefore has been limited to sizes that are a small fraction of the desired radiation frequency wavelength, λ. For example, semiconductor devices with areas of from about 0.1 $mm^2$ to about 0.5 $mm^2$ have sides of from about 0.32 mm to about 0.71 mm, respectively, so that peripheral loop antennas (with four sides used) have lengths from about 1.2 mm to about 2.8 mm, respectively. For a communication frequency of about 900 MHz with a wavelength, λ, of about 30 cm, the peripheral loop antennas having lengths from about 1.2 mm to about 2.8 mm are related to wavelength, λ, with ratios from about λ/250 to λ/110, respectively. Normally, for RF communication with small antennas having simple geometries, wavelengths of λ/32, λ/16, λ/4, λ2 and λ, are preferable. The wavelengths having ratios from about λ/250 to about λ/110 are far from the preferable values and hence generally are not expected to provide good antenna performance. More particularly, none of the antenna architectures that are used in embedded antenna designs for semiconductor devices have proved entirely satisfactory for reasons such as limited bandwidth, poor efficiency, high cost or design difficulty.

It is desirable that RF communication elements be fabricated using the same native processing steps as conventionally used for semiconductor devices while still providing antenna structures and designs that provide good RF communications.

In light of the foregoing, there is a need for improved semiconductor structures that perform RF communication functions where the RF elements for the RF communication functions can be fabricated using the native processing steps of semiconductor devices.

SUMMARY OF THE INVENTION

The present invention is an RF structure including a semiconductor chip with an RF element having an RF core with two electrically connected chip pads, including a chip carrier having two carrier pads connected to the two chip pads and including an antenna connected to the carrier pads and electrically connected to the chip pads and to the RF core. The antenna is formed of wire, printed conductors, seal rings or other structures on, below or above the top plane of the semiconductor chip.

In one embodiment, a semiconductor structure has a semiconductor primary element for performing a primary function and has a semiconductor secondary element, including a secondary core and including an antenna for performing an RF communication function. The primary element occupies a primary region and the secondary core occupies a secondary region of the semiconductor structure where the secondary region is much smaller than the primary region. The secondary region is formed with the same native processing as used for the primary region.

In one embodiment, the antenna for the secondary element surrounds the primary region whereby the antenna length has a wavelength that is only a fraction of the radiation wavelength, $\lambda$. For typical RF communications, the radiation frequency is nominally 900 MHz and has a nominal wavelength, $\lambda$, of 30 cm. Of course, other radiation frequencies may be used; especially in connection with any future standards that may be established.

In one embodiment, each RF element includes an RF coupling element (antenna), an RF interface for transforming signals between RF frequencies and data processing frequencies, memory for storing data, a logic controller for controlling the read/write of data and other communication operations and a power supply for powering the RF element. Typically, the power supply powers the RF element from received energy from incoming RF signals from an external RF communicator.

In another embodiment, the antenna is integrally formed with the semiconductor structure using native processing. When the semiconductor structure is small with a perimeter that has a wavelength less than the wavelength, $\lambda$, the antenna employs small loop, dipole and other antenna structures that are tailored to achieve resonance at the desired RF communication frequencies.

In an additional embodiment, the antenna is located around the perimeter of a semiconductor die juxtaposed above the seal rings for the die.

In a still additional embodiment, the antenna for RF communications is fabricated with internal conductors located in one or more internal layers of the semiconductor die.

In a further embodiment, the antenna for RF communications is fabricated with internal conductors that constitute one or more seal rings for the semiconductor die.

In a still further embodiment, the antenna is fabricated with the packaging for the semiconductor die.

In a still additional embodiment, the antenna is formed of a wire bonded to and connecting between carrier pads and the antenna extends above a plane including the carrier pads and a chip.

In one embodiment, a structure includes a semiconductor chip including a communication element for performing a wireless communication function where the communication element has a communication core occupying a region of the semiconductor chip, a plurality of chip pads with two of the chip pads electrically connected to the communication core; a chip carrier for carrying the semiconductor chip where the chip carrier includes a plurality of carrier pads with two of the carrier pads connected to the two chip pads; and an antenna connected to the carrier pads and electrically connected to the chip pads and to the communication core.

The foregoing and other objects, features and advantages of the invention will be apparent from the following detailed description in conjunction with the drawings.

BRIEF DESCRIPTION OF THE DRAWINGS

FIG. 1 depicts a semiconductor chip having a semiconductor primary element and secondary RF element with an on-chip antenna.

FIG. 2 depicts a semiconductor chip having a semiconductor primary element and secondary RF element with an on-chip two-turn loop antenna.

FIG. 3 depicts a semiconductor chip having a semiconductor primary element and secondary RF element with an on-chip dipole antenna having an end pad tuning element.

FIG. 4 depicts a semiconductor chip having a semiconductor primary element and secondary RF element with an on-chip dipole antenna having an end T-shaped plate tuning element.

FIG. 5 depicts a semiconductor chip having a semiconductor primary element and secondary RF element with an on-chip dipole antenna having extended length.

FIG. 6 depicts a cross-sectional view of the chip of FIG. 2.

DETAILED DESCRIPTION

Figure 7:
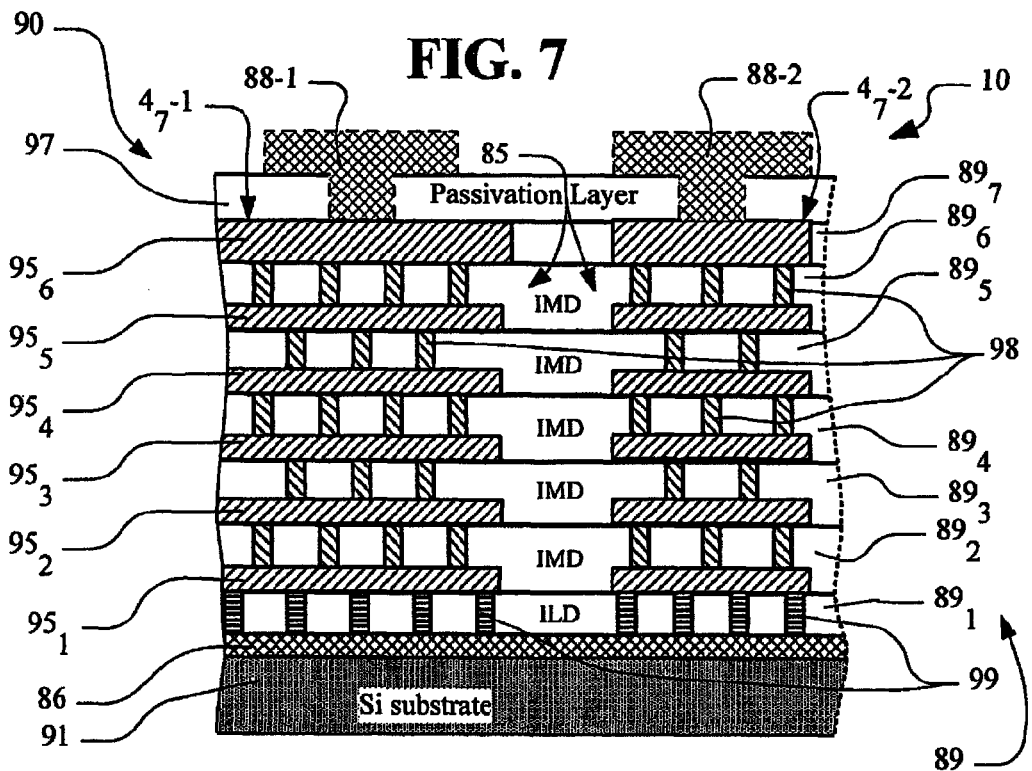
FIG. 7 depicts a cross-sectional view of an alternate chip of the FIG. 2 type.

In FIG. 1, a semiconductor chip 10 has a semiconductor primary element 1, a secondary RF element 2, and a seal-ring region 85. The semiconductor primary element 1 includes a primary element core 10 in a central region where the principal circuitry of the primary element 1 is located and a peripheral region where connection elements $1_1$, $1_2$, $1_3$ and $1_4$ are located around the perimeter of the primary element core $1_0$. The connection elements $1_1$, $1_2$, $1_3$ and $1_4$ are utilized to make connections between the circuitry of primary element core $1_0$ and packaging connections and other off-chip connections (not shown). The secondary RF element 2 includes an RF core in the form of secondary core 3 and an antenna $4_1$. The antenna $4_1$, in FIG. 1, is a single small loop antenna that connects through connection tabs $5_1$ and $5_2$ to the RF secondary core 3. The antenna $4_1$ is located in an antenna region that is the outer portion of the peripheral region of chip 10 and hence the length of the antenna $4_1$ is approximately equal to the perimeter of the semiconductor chip 10. The antenna $4_1$ is juxtaposed above the seal ring area 85. The seal ring area 85 is a region approximately 10 um to about 100 um wide extending in the peripheral region around the perimeter of chip 10 generally under the antenna $4_1$ (see FIG. 6 for further details). Typically, chips, like chip 10 of FIG. 1, have dimensions in the range of from about 5 $mm^2$ to about 100 $mm^2$. For a resonate frequency of 900 M Hz for the secondary element 2, the wavelength of the radiation frequency, $\lambda$, is about 30 cm.

Semiconductor devices with areas of from about 9 $mm^2$ to about 100 $mm^2$ have sides of from about 3 mm to about 10 mm, respectively, so that peripheral loop antennas such as antenna $4_1$ (with four sections, one on each side) have lengths from about 12 mm to about 40 mm, respectively. For a communication frequency of about 900 MHz with a wavelength, $\lambda$, of about 30 cm, the peripheral loop antennas having lengths about 12 mm to about 40 mm and are related to wavelength, $\lambda$, with ratios of about $\lambda/25$ to $\lambda/8$, respectively. For RF communication with small antennas having simple geometries such as loop antenna $4_1$, wavelengths of $\lambda/25$ to $\lambda/8$ are within the tuning range of from $\lambda/32$ to $\lambda$ for resonate operation. Good antenna performance is achieved through tuning of the antennas by modifying the R, L and C values of the resonant network. The values of R, L and C for the antenna are modified by changing the dimensions of the conductor $4_1$ or by adding other conductor tuning patterns (not shown in FIG. 1, see FIG. 3, FIG. 4 and FIG. 5, for examples) which couple to conductor $4_1$. The sections that form the antenna, such as conductor $4_1$ in FIG. 1, may be present on a single layer or may be located on one or more additional layers (see FIG. 6 through FIG. 10 for a view of additional internal conductor layers). In determining resonance, it is noted that the velocity of electromagnetic waves is greater in free space than in antenna conductors. It is generally considered that the velocity in antennas is 95% of the free-space velocity of the speed of light, C. Such effect is useful as the antenna geometry is closer to the resonate wavelength for small semiconductor devices and hence such small devices are more easily tuned for resonance.

While antenna $4_1$ in FIG. 1 is shown as a loop antenna, such showing is only by way of example and any antenna design suitable for resonant wavelengths can be employed. The antenna $4_1$ has an antenna length that resonates for small semiconductor devices because the antenna length is increased by extending the antenna region around the peripheral region of the primary element 1 rather than only around the perimeter of the secondary core 3. The present invention combines the small secondary element and small secondary core 3 with a much larger primary element 1 and large primary core $1_0$. The secondary function in the form of an RF communication function is combined with a primary function on the same chip using the same native processing technology.

Each semiconductor device, in addition to the primary function has an RF communication function as the secondary function. The RF function may be completely independent of the primary function or alternatively may interact with the primary function. In one example, when the RF function is used in connection with a tag for tracking information about the semiconductor device, the RF function of the tag is independent of the primary function of the semiconductor device. In another example, when the RF function is used in connection with an RF communication port for the primary function of the semiconductor device, the RF function is logically integrated with the primary function of the semiconductor device.

The RF communication of the secondary function is implemented with RF transmission by a transmitter and with RF reception by a receiver of the secondary element. The secondary element is a small part of and is an integral part of the semiconductor device. The secondary element of the semiconductor device typically communicates with an external RF communicator such as a tag reader. The external RF communicator in some embodiments can be the secondary element of another semiconductor device. Accordingly, the RF communication of a secondary element of one semiconductor device can be to another secondary element of another semiconductor device or can be to an external RF communicator.

The RF communication for the secondary function of the secondary element is through an antenna for the secondary element. Antennas that are an integral part of the semiconductor device are defined as internal antennas. Communications with an internal antenna are with an external antenna of an RF communicator or with an internal antenna of another semiconductor device.

In FIG. 2, a semiconductor chip 10 has a semiconductor primary element 1 and secondary RF element 2 with an on-chip small two-turn loop antenna $4_2$ including outer loop $4_2$-1 and inner loop $4_2$-2. The primary element 1 includes a primary element core 10 in a central region where the principal circuitry of the primary element 1 is located and a peripheral region where connection elements $1_1$, $1_2$, $1_3$ and $1_4$ are located around the perimeter of the primary element core $1_0$. The connection elements $1_1$, $1_2$, $1_3$ and $1_4$ are utilized to make connections between the circuitry of primary element core $1_0$ and packaging connections and other off-chip connections (not shown).

In FIG. 2, the primary element core $1_0$ in a central region includes, by way of example, a TPRX region for receiving communications according to the TP protocol, a TPTX region for transmitting communications according to the TP protocol, a phase-locked loop (PLL) region, two clock regions (CLOCK) for generating and distributing clock signals, a BAND GAP & MIS region for providing voltage referenced to the band gap voltage, an amplifier (AMP) region for amplifying signals and a DIGITAL region for digital signal processing. The individual contact pads of the connection elements $1_1$, $1_2$, $1_3$ and $1_4$ are shown in detail. The areas between the different named regions of the primary element core $1_0$ are principally used for interconnections among those regions and to and from the connection elements $1_1$, $1_2$, $1_3$ and $1_4$. A wide variety of designs for the primary element core $1_0$ and the primary function or functions that it performs are now well known and many more will be developed in the future. The particular primary function or functions of the primary element core $1_0$ are not essential and may be any design.

In FIG. 2, the antenna $4_2$ is a small two-turn loop antenna including outer loop $4_2$-1 and inner loop $4_2$-2. The inner loop $4_2$-2 connects at the secondary core 3 and extends about the perimeter of the chip 10 once around the chip 10 until it becomes the outer loop $4_2$-1, extends about the perimeter of the chip 10 once around the chip 10 as the outer loop $4_2$-1 until it reaches the secondary core 3, crosses in a crossing region with a crossing connection $4_C$ that connects to the secondary core 3. The crossing connection, $4_C$, is implemented as a conductor that connects from outer loop $4_2$-1 to the communication element core 3 without shorting to the inner loop $4_2$-2. Such a crossing connection is formed, for example, by using metal connections in a lower layer (preferable, the next lower level such as top metal, see $95_6$ as described in connection with FIG. 6). The length of the antenna $4_2$ is approximately equal to twice the perimeter of the semiconductor chip 10.

The FIG. 2 embodiment is a square shaped spiral-wound loop antenna having 2 turns. For optimum performance, the antenna length is typically desired to be in similar range as the wavelength of the wave carrier. Assuming the die size is 5 mm×5 mm, the antenna length is about 4 cm. For a 900 MHz carrier, the wavelength is about 30 cm. The antenna is somewhat shorter than a quarter wavelength and can appear capacitive. Added inductance coils can be used to cancel out the capacitive reactance to resonate the antenna. Therefore, in some cases, antenna signal reception is optimized by adding more turns. Typical design parameters for the antenna are considered based on the wavelength of the carrier signal and the die size.

The typical bandwidth of the loop antenna is about 10% of the center frequency of the carrier and has a frequency limit as high as 1 GHz. The gain ranges from about 1 to about 3 dB relative to an isotropic antenna.

In FIG. 3, a semiconductor chip 10 has a semiconductor primary element 1 and secondary RF element 2. The primary element 1 includes a primary element core $1_0$ in a central region where the principal circuitry of the primary element 1 is located and connection elements $1_1$, $1_2$, $1_3$ and $1_4$ located around the perimeter of the primary element core $1_0$. The connection elements $1_1$, $1_2$, $1_3$ and $1_4$ are utilized to make connections between the circuitry of primary element core $1_0$ and packaging connections and other off-chip connections (not shown).

In FIG. 3, the secondary RF element 2 includes an RF core in the form of a secondary core 3 and on-chip, internal, dipole antenna $4_3$ having sections including a first leg $4_3$-1 and a second leg $4_3$-2 extending along edges of the chip 10 that intersect near secondary core 3. The first leg $4_3$-1 and the second leg $4_3$-2 are of equal length and terminate in conductive pads $5_3$-1 and $5_3$-2, respectively. The conductive pads $5_3$-1 and $5_3$-2 are tuning sections for modifying the inductance values of the legs $4_3$-1 and $4_3$-2 for resonance and for tuning the electrical properties of the antenna. The conductive pads $5_3$-1 and $5_3$-2 have a pad dimension (width) different from the dimension (width) of the legs $4_3$-1 and $4_3$-2. Typically, the tuning section has a greater dimension than the other sections, that is, greater than the widths of the legs $4_3$-1 and $4_3$-2. Such designs shift the current distribution in the antenna toward the dipole-end tuning sections having the advantage of increasing the radiation resistance and improving antenna efficiency on reception and radiation. Another advantage of such designs is that antenna resonance is achieved while antenna length is shorter (due to die size limitation) than a quarter wavelength. In FIG. 3, the conductive pads $5_3$-1 and $5_3$-2 are shown as located on the top layer of the chip 10. In alternative embodiments, the conductive pads $5_3$-1 and $5_3$-2 are formed in different layers such as internal layers (see layer $95_6$ in FIG. 7, for example) and are electrically connected to the legs on the top layer through vias or through capacitive or inductive coupling.

While the FIG. 3 embodiment has rectangular shaped dipole ends $5_3$-1 and $5_3$-2, any other shape dipole-ends that effectively receive/transmit electromagnetic radiation can be used. Further, the dipole arm need not be in a straight shape pattern, but can be an alternating shape pattern such as an "alternating step" shaped pattern or any other type of pattern that can effectively receive/transmit electromagnetic radiation. An example of one such alternating antenna pattern is the alternating step pattern shown in FIG. 4.

In FIG. 4, a semiconductor chip 10 has a semiconductor primary element 1 and secondary RF element 2 with an on-chip dipole antenna $4_4$ with sections including a first leg $4_4$-1 and a second leg $4_4$-2. The primary element 1 includes a primary element core 10 in a central region where the principal circuitry of the primary element 1 is located, and a peripheral region where connection elements $1_1$, $1_2$, $1_3$ and $1_4$ are located around the perimeter of the primary element core $1_0$. The connection elements $1_1$, $1_2$, $1_3$ and $1_4$ are utilized to make connections between the circuitry of primary element core $1_0$ and packaging connections and other off-chip connections (not shown).

In FIG. 4, the secondary RF element 2 includes a secondary core 3 and on-chip dipole antenna $4_4$ where the first leg $4_4$-1 and the second leg $4_4$-2 extend in an antenna region that is the outer portion of the peripheral region along edges of the chip 10 that intersect near the secondary core 3. The first leg $4_4$-1 and the second leg $4_4$-2 are of equal length and each includes a square wave step section extending the length of the leg and the legs terminate in T-shaped plate ends $5_4$-1 and $5_4$-2, respectively. The plate ends $5_4$-1 and $5_4$-2 are tuning sections for modifying the reactive values of the legs for resonance and for tuning the electrical properties of the antenna.

The period of the "step" in the dipole-arm sections of legs $4_4$-1 and $4_4$-2 are chosen based on the bond pad pitch (defined as the sum of the width of each pad and the space between adjacent contact pads—See pads 1 of FIG. 2) to further enhance the shift of the current distribution. The "T" shape plates $5_4$-1 and $5_4$-2 are designed at the dipole-end for the same design consideration on increasing radiation resistance as described in connection with FIG. 3.

The typical bandwidth of the dipole antenna of FIG. 4 is about 10% of the center frequency of the carrier and has frequency limit as high as 8 GHz. The gain ranges from about 1 to about 3 dB relative to an isotropic antenna.

In FIG. 5, a semiconductor chip 10 has a semiconductor primary element 1 and secondary RF element 2 with an on-chip dipole antenna $4_5$ including a first inner leg $4_5$-1 and a second inner leg $4_5$-2 and an outer leg $4_5$-0. The primary element 1 includes a primary element core $1_0$ in a central region where the principal circuitry of the primary element 1 is located and connection elements $1_1$, $1_2$, $1_3$ and $1_4$ located in a peripheral region around the perimeter of the primary element core $1_0$. The connection elements $1_1$, $1_2$, $1_3$ and $1_4$ are utilized to make connections between the circuitry of primary element core $1_0$ and packaging connections and other off-chip connections (not shown).

In FIG. 5, the secondary RF element 2 includes an RF core in the form of secondary core 3 and includes on-chip dipole antenna $4_5$ where a first loop including the first inner leg $4_5$-1 together with a portion of outer leg $4_5$-0 extends in an antenna region that is the outer portion of the peripheral region along one edge of the chip 10 and a second loop including the second inner leg $4_5$-2 together with a portion of outer leg $4_5$-0 extends in an antenna region that is the outer portion of the peripheral region along an adjacent edge of the chip 10. The loops are connected to communication element core 3. The first inner leg $4_5$-1 together with a portion of outer leg $4_5$-0 and the second inner leg $4_5$-2 together with a portion of outer leg $4_5$-0 are of equal length and each terminates in a conductive pad end $5_5$-1 and $5_5$-2, respectively, which are tuning sections for modifying the reactance values of the legs for resonance and for tuning the electrical properties of the antenna.

The folded dipole antenna embodiment of FIG. 5 typically has a larger radiation resistance that is typically four times that of a dipole antenna. Rectangular shaped plates $5_5$-1 and $5_5$-2 are attached at the dipole ends for improving antenna performance on reception and transmission.

The antenna designs for on-chip, build-in, internal antennas have been described for various embodiments in FIG. 1 through FIG. 5. Additional embodiments combine different types of antennas to form "hybrid" antennas. For example, a folded dipole antenna is connected to a dipole antenna to form a "hybrid" antenna for enhancing the performance of a build-in antenna.

The various embodiments of build-in antennas described are constructed by using the contact pad metal, which is typically of an aluminum copper material that is available in the native process for bonding pads in semiconductor manufacturing. The antenna design is patterned by using the mask typically used for defining the bonding pads. When these native processing steps are employed, no additional manufacturing cost is in involved in building the internal antennas.

FIG. 6 depicts a cross-sectional view of a portion of the chip 10 of FIG. 2 in a peripheral region along section line 6S-6'S showing the antenna conductors of outer loop $4_2$-1 and inner loop $4_2$-2 and the structure underneath. The antenna conductors of outer loop $4_2$-1 and inner loop $4_2$-2 are juxtaposed above the seal ring area 85. The seal ring area 85 is a region approximately 10 um to about 100 um wide extending in the peripheral region around the perimeter of chip 10.

The chip 10 has a silicon substrate 91 that supports a plurality of insulating dielectric layers 89, including a layer of inter-layer dielectric ILD $89_1$, and layers of inter-metal-dielectrics IMDs $89_2$, $89_3$, $89_4$, $89_5$, $89_6$ and $89_7$, and a plurality of conductive layers 95, including layers $95_1$, $95_2$, $95_3$, $95_4$, $95_5$ and $95_6$. The conductive layers 95 are interconnected by a plurality of connections in the form of vias 98 that connect through the dielectric layers of IMDs to the conductive layers 95. Typically, the first layer $95_1$ is interconnected to the silicon substrate 91 by through-layer connectors in the form of contacts 99 to establish mechanical support for all layers above silicon substrate. The particular arrangement of the seal ring elements including the through-layer connectors in the form of vias 98 and of contacts 99, the dielectric layers 89 and conductive layers 95 is to provide mechanical structure and support around the periphery of chip 10. In general, the metal elements including vias 98 and contacts 99 and the conductive layers 95 are all connected together from bottom to top forming an interconnected metal grid structure that mechanically supports the dielectric layers 89. The antenna conductors of outer loop $4_2$-1 and inner loop $4_2$-2 are formed on a passivation layer 97 that is above the top conductive layer $95_6$. The antenna conductors of outer loop $4_2$-1 and inner loop $4_2$-2 are formed on the semiconductor structure of chip 10 using the native processing steps that are used for the other layers of chip 10.

In FIG. 6, the interlayer metal conductors 95 are typically a metal conductor such as aluminum or copper having a thickness in the range of about 300 nm to about 600 nm. The top-layer metal $95_6$ can be of the similar material as the interlayer metal, and typically has a thickness thicker than that of the interlayer metal. Typically, the top-metal layer is in the range of about 600 nm to about 1000 nm. The metal for antennas $4_2$-1 and $4_2$-2 is typically an alloy of aluminum copper having a thickness in the range of about 800 nm to about 1500 nm.

The Interlayer Dielectric ("ILD") layers $89_1$ is typically of an oxide insulator having a thickness in the range of about 300 nm to about 800 nm. The Inter-Metal Dielectric ("IMD") layers 89 are typically of an oxide or a dielectric having dielectric constant lower than the oxide ("Low-K dielectric"). The IMD layers 89 can also comprise composite dielectrics having different dielectric constants. A typical thickness of the IMD layers lies in the range of about 300 nm to about 1500 nm. The passivation layer 97 is typically a composite dielectric comprising a plurality of layers from the group of nitride, oxynitride and oxide. The typical thickness of the passivation layer is in the range of about 1500 nm to about 1700 nm.

The Seal-Ring region 85 typically has a dimension on width in the range of about 10 um to about 100 um, and is an essential design used to provide mechanical support of the chip and insulation around the chip periphery to block ions and other chemical elements from diffusing into the chip area where active circuits reside.

In one alternate embodiment, the seal ring structure disposed in a peripheral region under the antenna can serve as a ground or other reference level.

Figure 8:
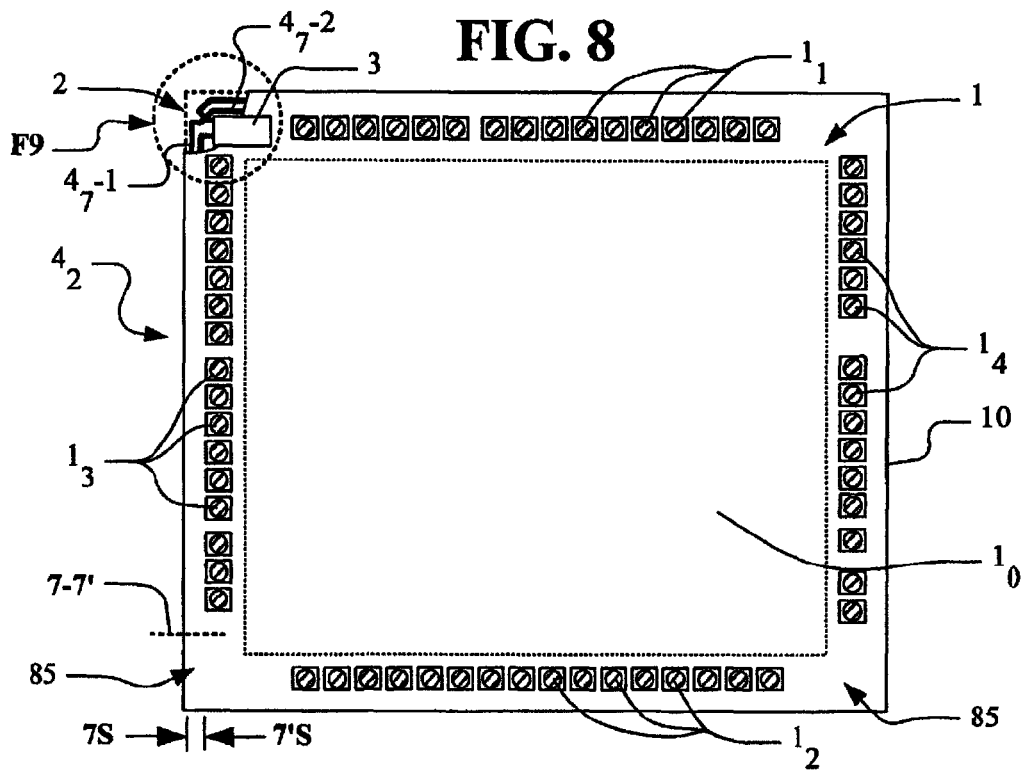
FIG. 8 depicts a top view of an alternate chip of FIG. 7.

FIG. 7 depicts a cross-sectional view of a portion of an alternate embodiment of chip 10 of FIG. 2 in a sectional region 7S-7'S from FIG. 8 (FIG. 8 is an alternate embodiment of FIG. 2). The seal ring area 85 is a region approximately 10 um to about 100 um wide extending around the perimeter of chip 10 (see FIG. 8). In the FIG. 7 embodiment, the left seal ring is a section of the antenna outer loop $4_7$-1 and the right seal ring is a section of the antenna inner loop $4_7$-2. In FIG. 7, in a first embodiment, the pad metal conductors 88-1 and 88-2 (shown by broken lines and optionally connected to antenna loops $4_7$-1 and $4_7$-2 in an alternate embodiment) should be considered not present and hence should be ignored for purposes of the first embodiment. In a second embodiment of FIG. 7, the antennas $4_7$-1 and $4_7$-2 are extended by pad metal conductors 88-1 and 88-2, respectively, through the passivation layer 97.

In FIG. 7, the chip 10 has a silicon substrate 91 that supports a plurality of insulating dielectric layers 89, including a layer of inter-layer dielectric ILD $89_1$, and layers of inter-metal-dielectrics IMDs $89_2$, $89_3$, $89_4$, $89_5$, $89_6$ and $89_7$, and a plurality of conductive layers 95, including layers $95_1$, $95_2$, $95_3$, $95_4$, $95_5$ and $95_6$. The conductive layers 95 are interconnected by a plurality of connections in the form of vias 98 that connect through the dielectric layers 89 to the conductive layers 95. The first layer $95_1$ is interconnected by through-layer connectors in the form of contacts 99 to an insulating layer 86, such as oxide, on top of the substrate 91 to establish mechanical support for all layers above oxide layer 86 and silicon substrate 91. The oxide layer 86 electrically insolates the conductive metal elements from the silicon substrate 91. Accordingly, the metal grid formed by the conductive layers 95, including layers $95_1$, $95_2$, $95_3$, $95_4$, $95_5$ and $95_6$ interconnected by a plurality of through-layer connectors in the form of vias 98 and through-layer connectors in the form of contacts 99 through the dielectric layers 89 collectively form antennas; specifically, the left seal ring forms the antenna $4_7$-1 and the right seal ring forms the antenna $4_7$-2 where the antenna $4_7$-1 and the antenna $4_7$-2 are electrically isolated around the periphery except where connected at one location (see FIG. 8 and FIG. 9).

In FIG. 8, a semiconductor chip 10 has a semiconductor primary element 1, a secondary RF element 2, and a seal-ring region 85. The primary element 1 includes a primary element core $1_0$ in a central region where the principal circuitry of the primary element 1 is located and a peripheral region where connection elements $1_1, 1_2, 1_3$ and $1_4$ are around the perimeter of the primary element core $1_0$. The connection elements $1_1, 1_2, 1_3$ and $1_4$ are utilized to make connections between the circuitry of primary element core $1_0$ and packaging connections and other off-chip connections (not shown). The secondary RF element 2 includes a secondary core 3 and an outer antenna loop $4_7$-1 and an inner antenna loop $4_7$-2 where the loops $4_7$-1 and $4_7$-2 are the left and right seal ring structures in the view of FIG. 7. The antenna loops $4_7$-1 and $4_7$-2 in FIG. 8 form a small two-turn loop antenna that connect to the secondary RF communication element core 3. The cross-over connection between the antenna outer loop $4_7$-1 and inner loop $4_7$-2 is located in close proximity to the secondary core 3 and the F9 crossing region is shown in expanded detail in FIG. 9.

In FIG. 8, the length of each loop, that is the length of the antenna outer loop $4_7$-1 and length of the inner loop $4_7$-2, is approximately equal to the perimeter of the semiconductor chip 10. The antenna outer loop $4_7$-1 and inner loop $4_7$-2 occupy a region that has a range from approximately 20 um to about 100 um wide extending around the perimeter of chip 10, between the edge of the chip 10 and the connection elements $1_1, 1_2, 1_3$ and $1_4$. Typically, chips like chip 10 of FIG. 8 have areas in the range of from about 5 mm² to about 100 mm². For an antenna operating at a communication frequency of about 900 MHz and having a wavelength, $\lambda$, of about 30 cm, the peripheral loop antennas, with the outer loop $4_7$-1 and the inner loop $4_7$-2, have lengths over a range from about 9.3 mm to about 40 mm. Such loops for a wavelength, $\lambda$, of about 30 cm have lengths that are a fraction of wavelength, $\lambda$. For RF communication with small antennas having simple geometries, such as loop antennas $4_7$-1 and $4_7$-2, the wavelengths are within the expected range for resonate operation and hence achieve good antenna performance.

Figure 9:
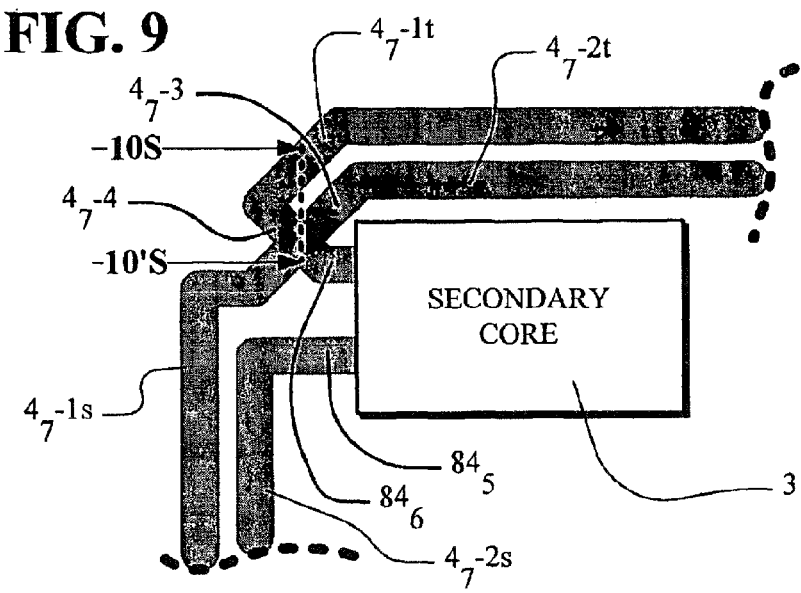
FIG. 9 depicts an exploded view of the crossing region near the secondary core of FIG. 8.

In FIG. 9, schematic details of the crossing region F9 of FIG. 8 are shown. The outer loop $4_7$-1 extends all around the chip 10 of FIG. 8 and appears at the top of FIG. 9 as outer loop $4_7$-1$t$ and appears on the left side of FIG. 9 as outer loop $4_7$-1$s$. The inner loop $4_7$-2 extends all around the chip 10 of FIG. 8 and FIG. 2 and appears at the top of FIG. 9 as inner outer loop $4_7$-2$t$ and appears on the left side of FIG. 9 as inner loop $4_7$-2$s$. The crossing connection between the antenna outer loop $4_7$-1$s$ (at the side) and inner loop $4_7$-2$t$ (at the top) is the crossing connector $4_7$-3 located in close proximity to the secondary core 3. The outer loop $4_7$-1$t$ at the top provides a connection to the core 3 through connector $4_7$-4 and the feed-line $84_6$. The connector $4_7$-3 crosses under the connector $4_7$-4. The inner loop $4_7$-2$s$ at the side provides a connection to the core 3 through feed-line $84_5$.

In FIG. 9, the connectors $4_7$-3, $4_7$-4 and feed-lines $84_5$ and $84_6$ are examples of core connectors for connecting the antenna sections $4_7$-1 and $4_7$-2 to the RF secondary core 3.

Figure 10:
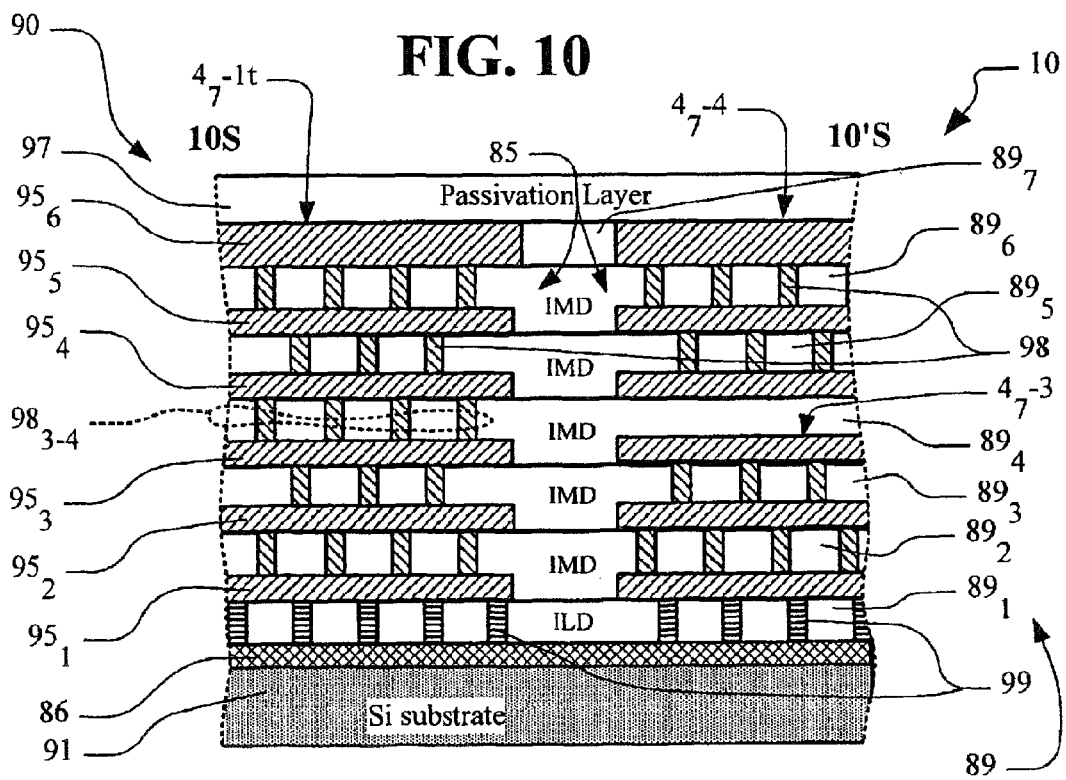
FIG. 10 depicts a cross-sectional view along the section line 10S-10'S of the FIG. 9.

In FIG. 10, a sectional view taken along section line 10S-10'S of FIG. 9 depicts the crossing region of the antenna loops $4_7$-1 and $4_7$-2. In FIG. 10, the chip 10 has a silicon substrate 91 that supports a plurality of insulating dielectric layers 89, including a layer of inter-layer dielectric ILD $89_1$, and layers of inter-metal-dielectrics IMDs $89_2, 89_3, 89_4, 89_5, 89_6$ and $89_7$, and a plurality of conductive layers 95, including layers $95_1, 95_2, 95_3, 95_4, 95_5$ and $95_6$. The conductive layers 95 are interconnected by a plurality of connections in the form of vias 98 that connect through the dielectric layers 89 to the conductive layers 95. The first layer $95_1$ is interconnected by through-layer connectors in the form of contacts 99 to an oxide layer 86 on top of the substrate 91 to establish mechanical support for all layers above oxide layer 86 and silicon substrate 91. The oxide layer 86 electrically insolates the conductive metal elements from the silicon substrate 91, and typically has a thickness ranging from about 200 nm to about 800 nm.

In FIG. 10, the antenna section $4_7$-1$t$ on the left is formed by the metal grid and specifically includes the vias $98_{3-4}$ between the layers $95_3$ and $95_4$. Accordingly, antenna section $4_7$-1$t$ extends as a conductive grid from the oxide layer 86 to the passivation layer 97.

In FIG. 10, the antenna crossing connector $4_7$-3 and the antenna crossing connector $4_7$-4 are formed by the metal grids including conductive layers 95, including layers $95_1, 95_2, 95_3, 95_4, 95_5$ and $95_6$ interconnected by a plurality of through-layer contacts 99 and through-layer vias 98 through the dielectric layers 89. The vias $98_{3-4}$ between the layers $95_3$ and $95_4$ are present on the left so that antenna section $4_7$-1$t$ is electrically connected from contacts 99 to top conductor $95_6$. The vias $98_{3-4}$ between the layers $95_3$ and $95_4$ are absent on the right so that dielectric layer $89_4$ electrically isolates antenna crossing conductor $4_7$-4 from antenna crossing conductor $4_7$-3. The antenna crossing conductor $4_7$-3 is below and crosses under the antenna crossing conductor $4_7$-4. The vias that are removed on the right (the equivalent of the vias $98_{3-4}$ on the left) between the layers $95_3$ and $95_4$ can be vias of other layers such as the vias between the layers $95_4$ and $95_5$ or between the layers $95_2$ and $95_3$ or both. While vias can be removed to achieve electrical isolation in a crossing region, any one or more of the metal layers 95 between removed vias can also be removed.

While the antenna sections $4_7$-1 and $4_7$-2 in FIG. 9 (and the their crossing connections $4_7$-3 and $4_7$-4 in FIG. 10) are horizontally separated (side-by-side) as shown in FIG. 10, the antenna sections in an alternate embodiment can be vertically separated. For example, such an alternate embodiment has the equivalent of antenna sections $4_7$-1 and $4_7$-2 conductors vertically separated in the same manner that crossing connections $4_7$-3 and $4_7$-4 are vertically separated by dielectric region $89_4$. More generally, the structure 10 can be arranged with any combination of vertical or horizontal conductors with vertical and/or horizontal electrical isolation. While FIG. 1 through FIG. 5 depict the antennas as being located on the top layer (as shown, for example, in FIG. 6), those antennas can all be arranged on different layers with different crossing layers in the manner described in connection with FIG. 10.

Figure 11:
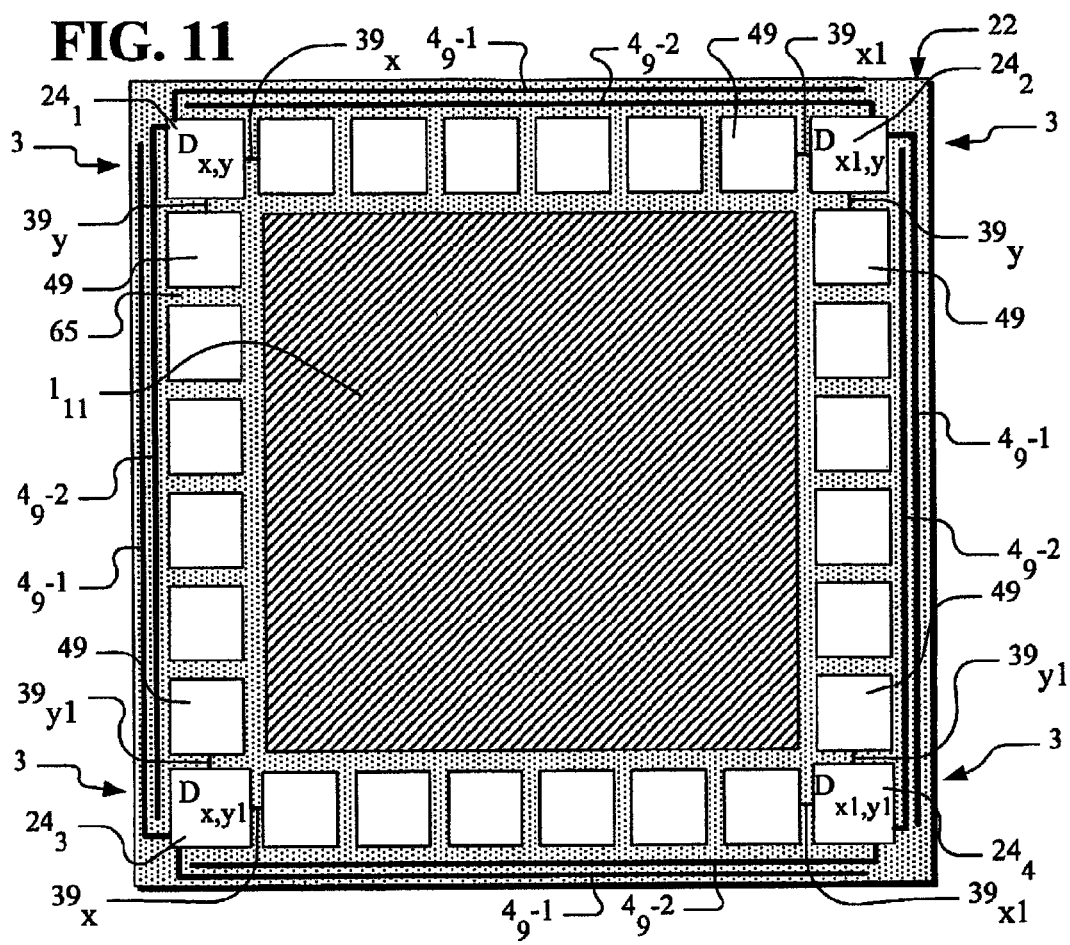
FIG. 11 depicts a typical semiconductor die having bound RF tags.

In FIG. 11, the semiconductor die 22 is a typical die that has four bound RF tags 24, including tags $24_1, 24_2, 24_3$ and $24_4$ that store the Tag IDs $D_{x,y}, D_{x1,y}, D_{x,y1}$, and $D_{x1,y1}$. Four tags can be provided in some embodiments since in many designs the corner positions of dies are left vacant. The inclusion of more than one tag per die is useful for adding extra storage capacity per die and/or for having redundancy. Redundancy is useful when high reliability is desirable. The inclusion of one or more tags normally does not interfere with the normal layout and functioning of the native primary core circuitry of primary core $1_{11}$. Although four tags on a die are shown by way of example, the number of tags on each die can be a different number, and can be less than four depending on the vacant space in the corners of the die or other die layout considerations. The RF tags 24 are physically bound to the die 22. In one embodiment the tags 24 are manufactured and embedded as electronic circuits using the native processing technology used for the circuitry of primary core $1_{11}$. Each of the tags 24 constitutes a secondary core 3 (analogous to the RF cores like secondary cores 3 in FIG. 1 through FIG. 5). In another embodiment, the RF tags 24 are manufactured with an external process technology and the tags are then attached to the die 22 as add-on tags. In either of the embodiments, the RF tags are bound to the dies. The area occupied by one core of tag 24, excluding the antenna, is typically approximately 1/100 or smaller of the total area of the die 22.

Figure 14:
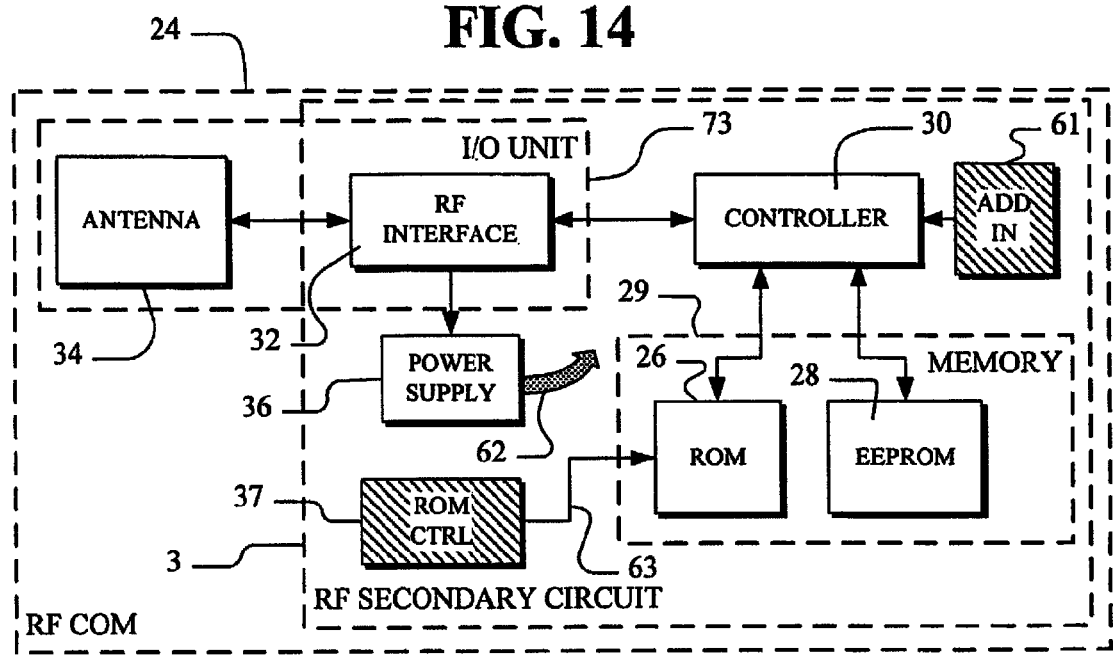
FIG. 14 depicts a typical RF tag electrical schematic diagram.

In FIG. 11, when more than one tag is present on a die, each tag design may be different. In a typical example with four tags as shown in FIG. 11, the tag designs are all the same and are as shown in FIG. 14 except that the ADD IN circuit 61 differs on each tag in order to provide a unique address to distinguish each of the four tags from each other. Logically, each tag on a die provides different low-order address bits to distinguish it from each of the other tags. In one implementation for four tags, two low-order address bits are provided by ADD IN circuit 61 on each tag. The two low-order address bits are provided, for example, by two voltage levels (such as Vcc and ground) representing logical "1" and logical "0". The two low-order address bits are coded for tags $24_1$, $24_2$, $24_3$ and $24_4$ as 00, 01, 10 and 11, respectively. The two coded voltage levels are provided using switches, direct wire connections (e.g. metal wires or interconnects) or any other convenient method. Switches or direct wire connections with coded values are readily implemented using mask layout patterns with well-known mask-ROM technology.

In FIG. 11, each of the tags $24_1$, $24_2$, $24_3$ and $24_4$ includes an outer antenna leg $4_9$-1 extending along one side of chip 22 and an inner antenna leg $4_9$-2 extending along an orthogonal side of chip 22. The two legs for each tag form a symmetrical dipole antenna where each leg, in one embodiment, is approximately λ/4 in length so that the dipole antenna with two legs, antenna leg $4_9$-1 and antenna leg $4_9$-2, is approximately λ/2 in length. While dipole antennas are described, other appropriate antennas may also be employed. The antennas may be located on the surface as described in connection with FIG. 6 and FIG. 11 or may be located on internal layers as described in connection with FIG. 7 through and FIG. 10.

Figure 15:
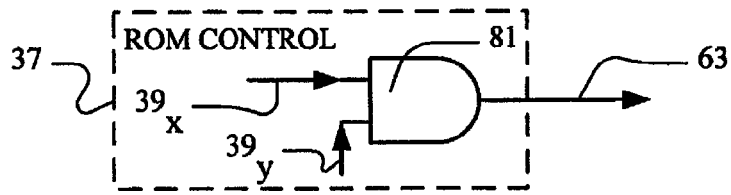
FIG. 15, FIG. 16 and FIG. 17 depict different embodiments of the ROM control in the tag of FIG. 14.

In FIG. 11, for an embodiment useful with FIG. 15, different ones of the die pad (also termed "chip pad") 49 connect to the input lines $39_x$ and $39_y$ of tag $24_1$, connect to the input lines $39_{x1}$ and $39_y$ of tag $24_2$, connect to the input lines $39_x$ and $39_{y1}$ of tag $24_3$ and connect to the input lines (connectors) $39_{x1}$ and $39_{y1}$ of tag $24_4$. The pair of input lines $39_x$ and $39_y$, the pair of input lines $39_{x1}$ and $39_y$, the pair of input lines $39_x$ and $39_{y1}$ and the pair of input lines $39_{x1}$ and $39_{y1}$ are energized with DC power when the die is energized for a sort test. The tags $24_1$, $24_2$, $24_3$ and $24_4$ are each powered during the sort test and are separately initialized by operation of communicator 40 of FIG. 26 addressing each of the tags and relying on the low-order bits from the ADD IN circuit 61. Alternatively, the inputs 39 are used as connectors for antennas (see for example, FIG. 23).

When the wireless tag 24 is manufactured with native semiconductor processing, the data base information specifying the layout patterns for the native tags 24 and for the primary function circuitry of primary core $1_{11}$ are merged into one common layout in a database. The layout information incorporating the information for tags 24 and the information for primary function circuitry of primary core $1_{11}$ are printed on a set of manufacturing masks and are processed simultaneously as part of the semiconductor processing. As a result, native embedded wireless tags 24 are part of the die 22 at the completion of processing. Due to the broad acceptance of standard CMOS processing, a wireless tag design based on standard CMOS processing is an embodiment convenient for many semiconductor manufacturers. The wireless tag 24, however, can be designed based on other types of process technologies, such as BiCMOS (i.e. technology combining a bipolar process and CMOS process), embedded non-volatile memory technologies (i.e. technology combining a non-volatile memory process and a CMOS process), or any other type of technology that permits manufacturing of integrated circuits. The nonvolatile memory process can be a process manufacturing Flash EEPROM, Ferroelectric RAM (FRAM), Magnetic RAM (MRAM), Phase-Change RAM (PCRAM), Organic RAM (ORAM), and Conductive Bridging RAM (CBRAM) all well-known in the art. The antennas as described in connection with FIG. 1 through FIG. 10 are manufactured using any of the foregoing standard processing technologies or any other processing technology.

Figure 12:
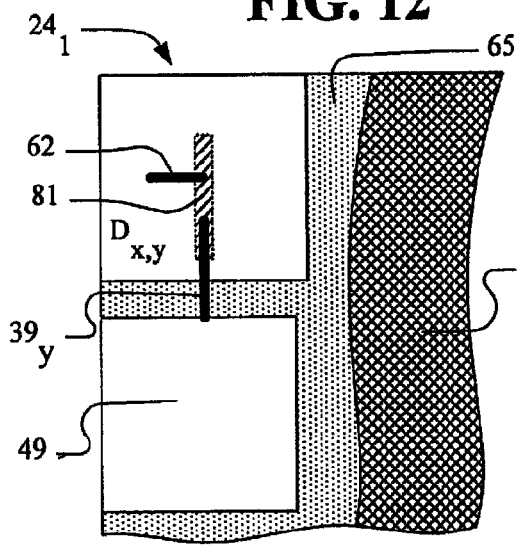
FIG. 12 depicts a portion of the die of FIG. 11 with an alternate wiring layout.
Figure 16:
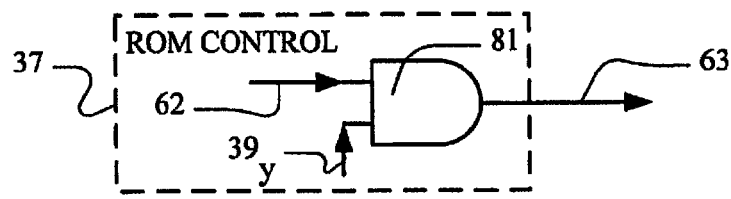

In FIG. 12, an alternate example of a portion of the die of FIG. 11 is shown that is useful with the FIG. 16 embodiment. The die pad (also termed "chip pad") 49 connects to the input line $39_y$ of tag $24_1$ and die pad (also termed "chip pad") 49 is located on top of the insulating layer 65 which is located on top of a conductive layer 66 which typically comprises a semiconductor substrate. The input 62 of gate 81 has a trace making contact to an output from the power supply 36 (see FIG. 14) internal to the tag $24_1$.

Figure 13:
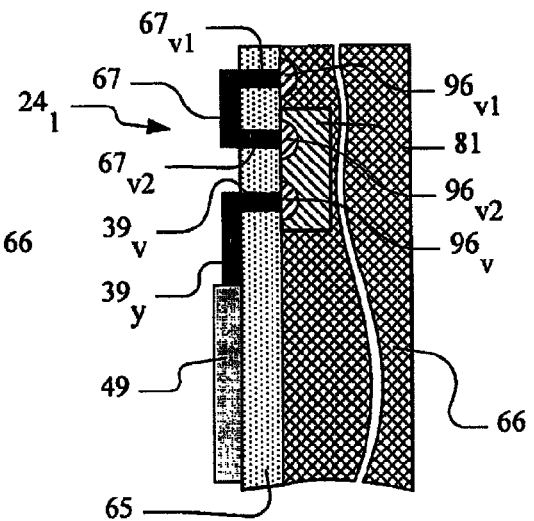
FIG. 13 depicts a portion of the die of FIG. 11 with another alternate wiring layout.
Figure 17:
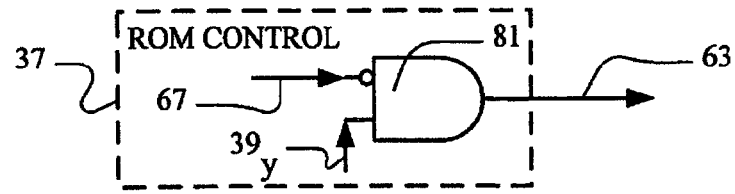

In FIG. 13, an alternate example of a portion of the die of FIG. 11 is shown that is useful with the FIG. 17 embodiment. The tag $24_1$ is a multilayer structure including a gate 81. The gate 81 receives one input $39_y$ and another input 67. The input $39_y$ is a trace that connects on the surface of layer 65 between pad 49 and the via $39_v$. The via $39_v$ is a connection through the insulating layer 65 to a first electrode $96_v$ of gate 81. The other input 67 to gate 81 connects as a trace on the surface of layer 65 between the via $67_{v1}$ and the via $67_{v2}$. The via $67_{v1}$ is a connection through the insulating layer 65 to an electrode $96_{v1}$ of region 66. The via $67_{v2}$ is a connection through the insulating layer 65 and connects to a second electrode $96_{v2}$ of gate 81. The gate 81 has an output (not shown) that connects to other circuitry (not shown) for tag $24_1$ as described in connection with FIG. 14 and FIG. 17. The FIG. 13 structure is schematic and any conventional structure can be employed that provides internal connections with appropriate logical levels to gate 81.

FIG. 14 depicts a typical RF tag electrical schematic diagram. FIG. 14 shows a functional block diagram of a typical RF tag 24 of the type bound to chain elements 22 as described in connection with FIG. 1, FIG. 7 and FIG. 8. The wireless tag 24 includes a memory 29 comprising a read only memory (ROM) 26 and an electrical erasable programmable read only memory (EEPROM) 28, a controller (CONTROLLER) 30, a radio-frequency interface (RF INTERFACE) 32, and a coupling element (RF COUPLING ELEMENT) 34. The RF-interface 32 provides power from the received RF signal to a power supply (POWER SUPPLY) 36 which generates a DC voltage (Vcc) on outputs 62 to power the other components of wireless tag 24. Typically, the power supply powers the tag from received energy from incoming RF signals from an RF communicator such as communicator 40 in FIG. 26. Alternatively, power supply 36 can also derive power from a DC power supply (not shown) conventionally present in the primary elements 1 of FIG. 1 through FIG. 5.

In some embodiments of tag 24, a ROM control (ROM CTRL) 37 provides a control input 63 to ROM 26 to enable data to be written into ROM 26. In some embodiments of tag 24, an address circuit (ADD IN) 61 provides address bits to controller 30 for distinguishing multiple tags on the same die. The RF-interface 32 and the coupling element 34 comprise the input/output (I/O) unit 73 for electronic communication with the stage communicator 40 of the type described in connection with FIG. 26 for processing tag information.

Figure 26:
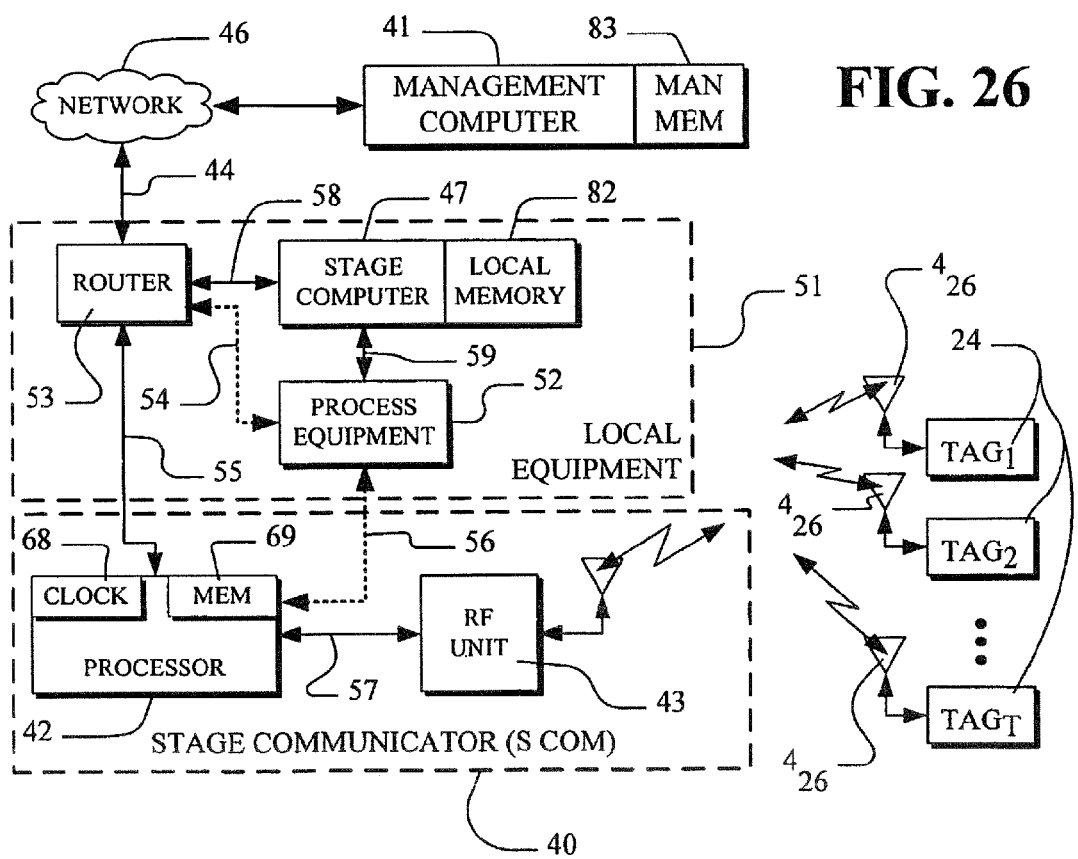
FIG. 26 depicts a typical stage communicator for RF communication with RF tags and for communication over a network to a management computer.

The tag 24 communicates with communicator 40 of FIG. 26 through the coupling element 34. The coupling element 34 is typically an antenna of the type having its impedance modulated by signals from RF interface 32. The ROM 26 is typically one-time programmable (OTP) and is used to store permanent data, such as a Die ID (also called "Chip ID"). The ROM 26 can be an electrically programmable ROM (EPROM), which permits information to be entered through electrical means, and/or can be a mask ROM, which permits information, be stored through a mask layout during the manufacturing process. When ROM 26 is an electrically programmable device, an enable signal on line 63 allows the controller 30 to address and store data into ROM 26 to initialize the tag 24. The EEPROM 28 is many-times programmable (MTP) and is used to store other types of data (for example, customer number and test results of functional tests for the die). In an alternative embodiment, a portion of EEPROM 28 can be configured to serve the function of ROM 26 and that portion thus configured can be electrically programmed Each tag typically has an identifier for security applications. The identifier typically comprises the Tag ID and a password that are used according to a security protocol for communication with a communicator.

In FIG. 15, FIG. 16 and FIG. 17, the ROM control 37 of FIG. 12 is shown in different embodiments used in connection with methods of initializing native-formed tags on dies. In FIG. 15, the ROM control 37 has two input lines that connect to AND gate 81. When power is applied to the two input lines, AND gate 81 is satisfied and therefore a write enable signal on line 63 is provided to the ROM 26. In FIG. 15, the two input lines $39x$ and $39y$ to AND gate 81 are from die pads of a die (see FIG. 11). In FIG. 16, the input line $39y$ is from a die pad of a die (see FIG. 11) and the line 62 is from the power supply 36 of FIG. 14. In FIG. 17, the input line $39y$ is from a die pad of a die (see FIG. 11) and the line 67 is a ground plane connection (see FIG. 13) of a die that connects through an inverting input to the gate 81. The ROM control 37 of FIG. 15, FIG. 16 and FIG. 17 includes AND gates with non-inverting or inverting inputs. Other types of logic gates, such as NAND gates, with and without inverting inputs and outputs can be employed.

When ROM 26 is enabled as described in connection with FIG. 15, FIG. 16 and FIG. 17 or is otherwise enabled in an equivalent manner, a communicator 40 of the FIG. 26 or equivalent type is then operated to write initialization data into ROM 26. When the power on either of the input lines to the AND gate 81 is removed, the ROM thereafter becomes and remains read only for normal tag operations.

The two input lines to the AND gate 81 become powered, for example during a wafer sort test, in each of the embodiments of FIG. 15, FIG. 16 and FIG. 17. During a sort test, dies are selected by application of DC power a die at a time for dies on a wafer. When the DC power is applied to one particular die for the sort test, the tag 24 for that particular die also receives the DC power. When thus powered during sort processing, the Tag ID is written into the tag 24 by operation of communicator 40 executing an Initiation routine. For other dies that are not being powered, the tag 24 on each of the not-selected-dies is passive. As each die is selected for sort testing on a wafer, the Tag ID and other initialization data is written until all die tags on the wafer have been initialized by execution of the Initialization routine.

Once a Tag ID is written during the initialization process, the tag is uniquely addressable using the Tag ID. Once a tag is initialized with a Tag ID, normal communication with that tag can occur allowing other information (such as testing results) to be stored into the tag's memory while sort testing on that die continues. Once the tag on one die is initialized, the process is repeated to initialize the next tag on the next die until all of the dies and tags are DC powered, sorted and initialized.

Figure 18:
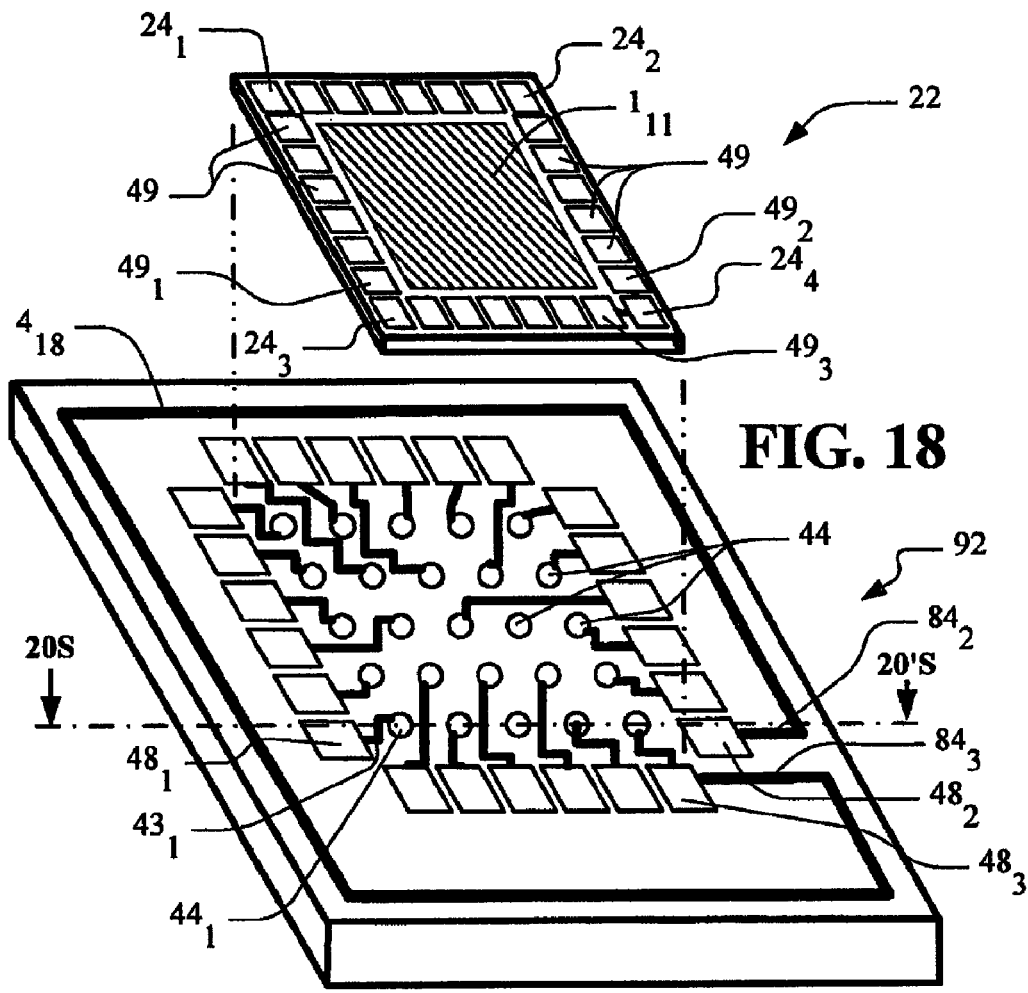
FIG. 18 depicts a schematic, isometric, exploded, top view of a chip carrier for a Ball Grid Array (BGA) package under a die of the FIG. 11 type.

In FIG. 18, for a Ball Grid Array package, the die 22 in an exploded view is positioned above a ball array chip carrier 92. The die 22 is typically like the die 22 of FIG. 11. The die 22 includes the connection pads 49, including typical pads $49_1$, $49_2$ and $49_3$, in a peripheral region around the perimeter but excluding the corners. In the corners are four RF tags $24_1$, $24_2$, $24_3$ and $24_4$ and in the center are the circuits of primary core $1_{11}$. Ball Grid Array packaging is well known in the semiconductor industry and has many variations. The ball array chip carrier 92 includes an array of carrier pads 48 (identified as $48_1$, $48_2$ and $48_3$ for illustration). Such pads are around the perimeter of the area where the chip is located for electrical connection to the chip pads 49 on the die 22. In the internal region of carrier 92, via pads 44 are located in an array. Each via pad 44 is for connection through a via from one side (shown) of the carrier 92 to the other side (see FIG. 19) of the carrier 92. Each of the pads 48 is connected to a different one of the via pads 44 by a conductive trace where trace $43_1$ connecting from pad $48_1$ to via pad $44_1$ is typical. When assembled, the bottom side of die 22 is placed down over the region of the via pads 44. A loop antenna $4_{18}$ extends around the perimeter of the chip carrier 92. The loop antenna $4_{18}$ connects to carrier pads $48_2$ and $48_3$ through feed-lines $84_2$ and $84_3$, respectively.

In the loop antenna embodiment of FIG. 18, only one of the tags 24 is used, for example tag $24_4$, with the loop antenna $4_{18}$. In dipole or other antenna configurations, two or more of the tags can be employed. The tag $24_4$ connects to the pads $49_2$ and $49_3$ on the die 22. When the die 22 is assembled with the chip carrier 92, the chip pads $49_2$ and $49_3$ are proximity to the carrier pads $48_2$ and $48_3$ and are electrically connected by bonding wires. In this manner the tag $24_4$ is electrically connected to the antenna $4_{18}$.

Figure 19:
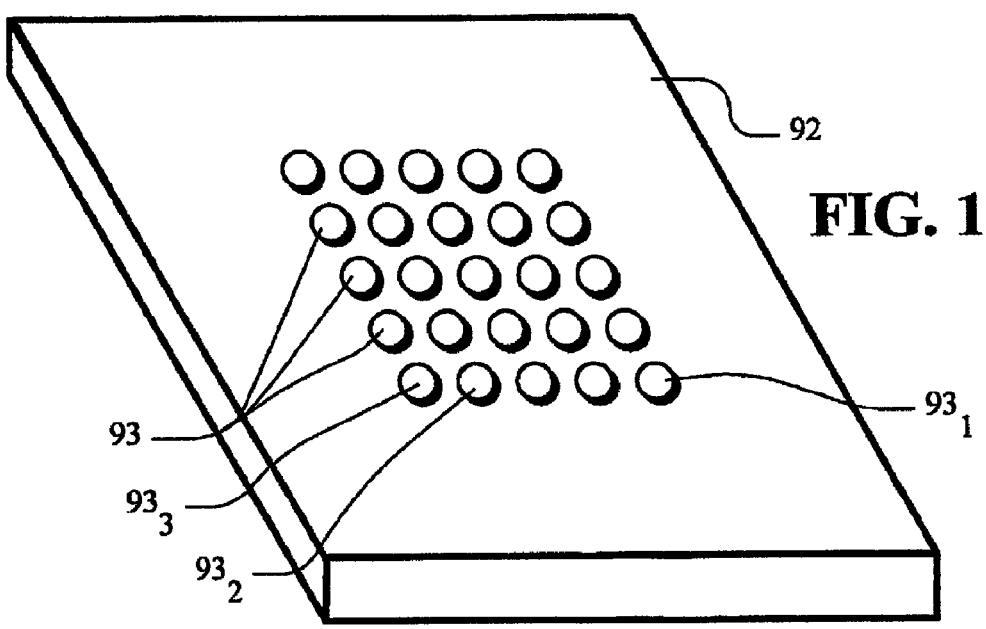
FIG. 19 depicts a schematic, isometric bottom view of the chip carrier of FIG. 18.

In FIG. 19 a schematic, isometric bottom view of the ball array chip carrier 92 of FIG. 18 is shown. The chip carrier 92 includes an array of contact balls 93 of which ball $93_1$ is typical. Ball $93_1$ connects to via $44_1$ of FIG. 18 which in turn connects to pad $48_1$. When die 22 is assembled with chip carrier 92, a wire bound connects chip carrier pad $48_1$ to the die pad (chip pad) $49_1$.

Figure 20:
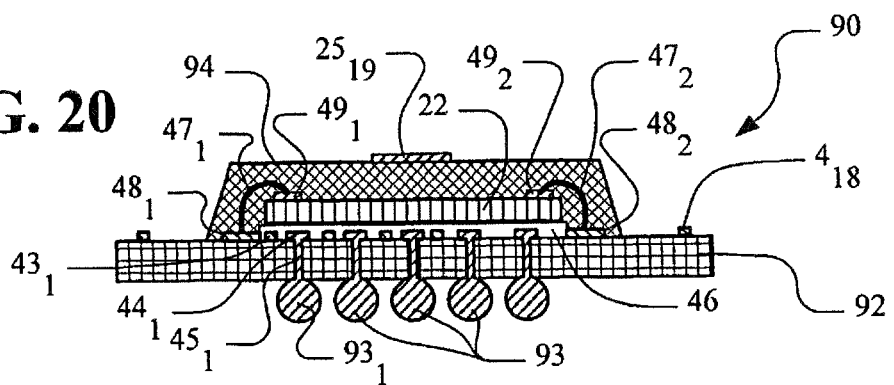
FIG. 20 depicts a schematic sectional view of a Ball Grid Array (BGA) package including the chip carrier and die along section line 20S-20'S of FIG. 18 with the chip carrier and die assembled and with packaging material added.

In FIG. 20, a schematic sectional view of a Ball Grid Array (BGA) package 90 is shown and includes a chip carrier 92 and a die 22 viewed along section line 20-20' of FIG. 18 with the chip carrier 92 and die 22 assembled. The assembled package 90 includes an insulating attaching layer 46 attaching the die 22 to the carrier 92 and includes an insulating compound 94 encapsulating the package 90. In FIG. 20, the pads $49_1$ and $49_2$ on the die 22 connect to the carrier pads $48_1$ and $48_2$, respectively, by the conductive bonding wires $47_1$ and $47_2$, respectively. The carrier pad $48_1$ connects to the via pad $44_1$ by the trace $43_1$. The via pad $44_1$ connects by the via $45_1$ through the carrier 92 from the top surface of the carrier 92 to the ball $93_1$ on the bottom surface of carrier 92.

The package 90 in one embodiment includes a tag $25_{19}$ for storing die and other information useful in semiconductor processing stages and useful in other stages and chains of stages. The tag $25_{19}$ is shown located on top of the package 90, but in alternate embodiments any one or more such tags can be located anywhere on or in the package 90. The tags $24_1$, $24_2$, $24_3$ and $24_4$ on die 22 of FIG. 11 and tag $25_{19}$ of FIG. 20 can all be present or alternatively, only any one or more of such tags may be present. In the embodiment of FIG. 18, FIG. 19 and FIG. 20, only a single loop antenna $4_{18}$ is used connected to tag $24_4$. Alternatively, two or more of the tags may have antennas so as to provide increased tag capacity or redundancy in case any particular one of the tags has errors or is inoperable. When multiple tags are employed, tags have different addresses so as to be operable only when addressed. When addressed at different times, conflicts between antenna operations are avoided. When addressed at the same time, different antenna frequencies or other means are used to avoid interference.

Figure 21:
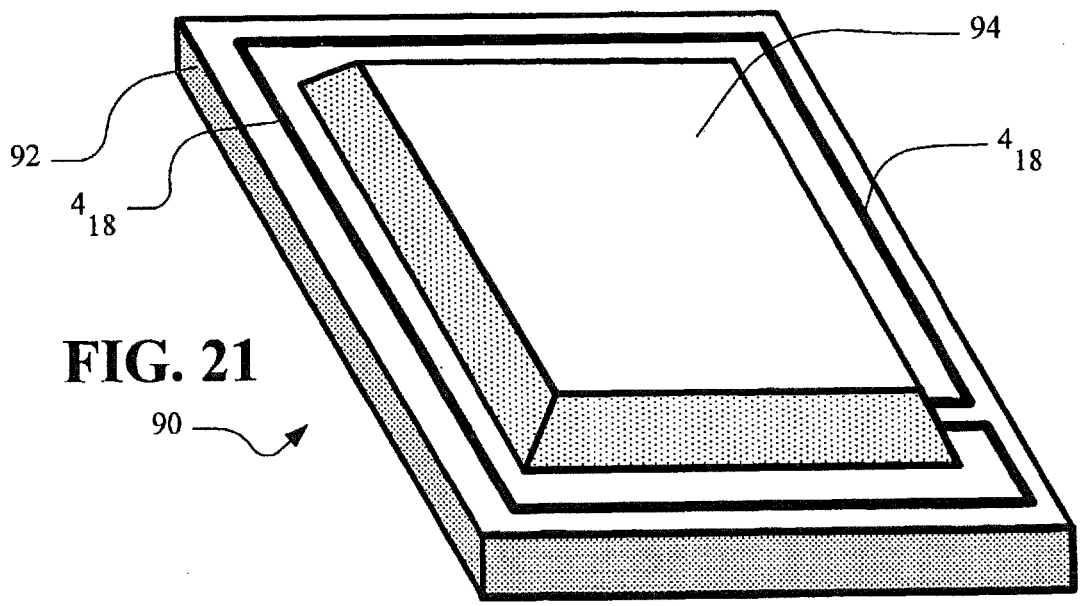
FIG. 21 depicts an isometric view of a finished package for the ball grid array of FIG. 18, FIG. 19 and FIG. 20 having a loop antenna.

In FIG. 21, an isometric view of a finished package 90 for the ball grid array of FIG. 18, FIG. 19 and FIG. 20 is shown with the loop antenna $4_{18}$ extending in a peripheral region around the perimeter of the base 92. The insulating compound 94 encapsulates the chip 22 bonding wires 47 and pads 48 (see FIG. 20) of the package 90. The antenna $4_{18}$ is not encapsulated so as not to impair antenna performance.

Figure 22:
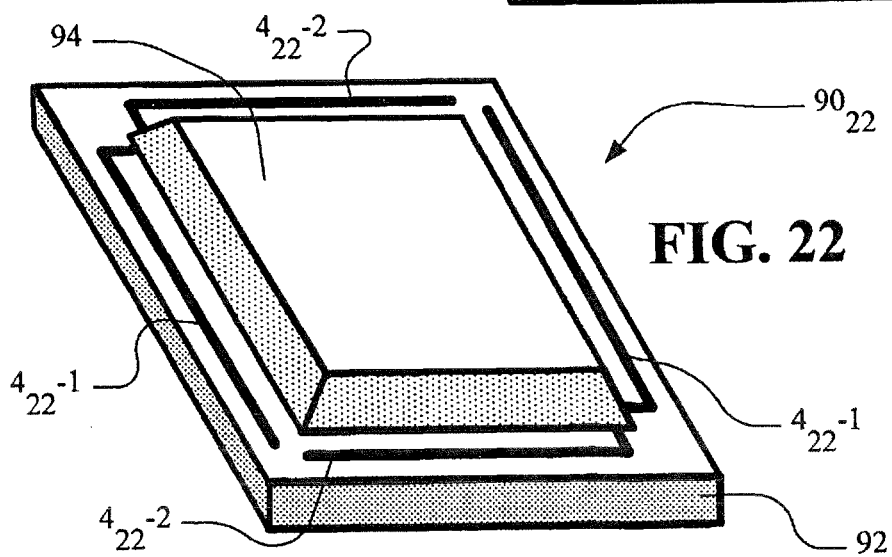
FIG. 22 depicts an isometric view of a finished package having two dipole antennas.

FIG. 22 depicts an isometric, reduced-size view of an alternate finished package $90_{22}$ for the ball grid array of FIG. 18, FIG. 19 and FIG. 20. The finished package $90_{22}$ includes two dipole antennas $4_{22}$, each dipole having a first leg $4_{22}$-1 and a second leg $4_{22}$-2. The legs for each dipole extend along intersecting sides of the base 92. The insulating compound 94 encapsulates the chip 22 bonding wires 47 and pads 48 (see FIG. 20) of the package 90. The antenna $4_{22}$ are not encapsulated so as not to impair antenna performance. In one embodiment, of FIG. 22, the encapsulated chip has a design similar to chip 22 of FIG. 11. However, only the tags 24, and $24_4$ are used, each having the dipole antenna legs $4_{22}$-1 and $4_{22}$-2 of FIG. 22, analogous to antenna legs $4_9$-1 and $4_9$-2 of FIG. 11.

Figure 23:
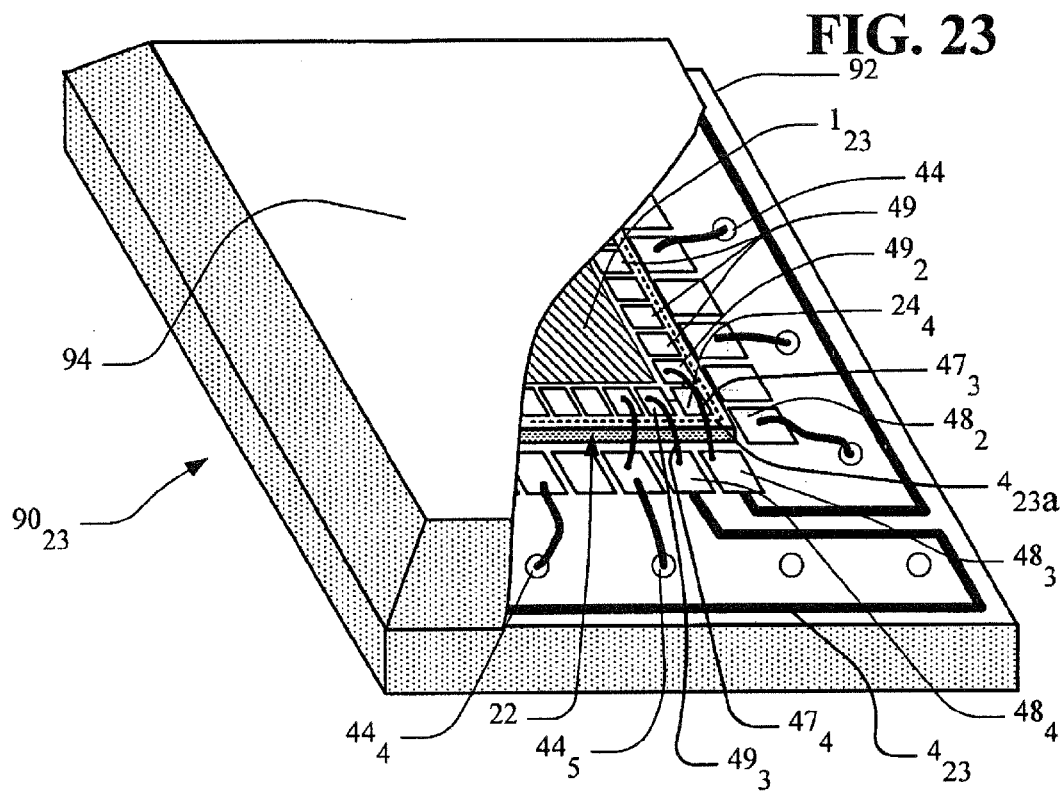
FIG. 23 depicts an isometric, top, partially-cut-away view of a finished package for an alternate ball grid array.

In FIG. 23, an isometric, top, partially-cut-away view of a finished package $90_{23}$ for an alternate ball grid array is shown. The finished package $90_{23}$ differs from the package of FIG. 18 through FIG. 21 in that the balls 93 (see FIG. 24) extend over a larger area of the base 92. Some of the via pads 44, of which via pads $44_4$ and $44_5$ are typical, are located between the edge of base 92 and the base pads 48, of which pads $48_2$, $48_3$ and $48_4$ are typical. The loop antenna $4_{23}$ extends in a peripheral region around the perimeter of the base 92 between the edge of base 92 and the via pads 44. The insulating compound 94 encapsulating the package $90_{23}$ extends over the pads 44 and the antenna $4_{23}$. The antenna $4_{23}$ is thus embedded within the encapsulating material of insulating compound 94 and therefore is not exposed to moisture or other environmental conditions. The insulating compound 94 is a good dielectric so as not to impair antenna performance.

In FIG. 23, antenna $4_{23}$ connects to the carrier pads $48_3$ and $48_4$. The pads $48_3$ and $48_4$ are connected by bonding wires $47_3$ and $47_4$, respectively to chip pads $49_2$ and $49_3$, respectively. The chip pads $49_2$ and $49_3$ connect to tag $24_4$ which is one of the secondary cores 3 (RF cores) as described, for example, in connection with FIG. 11. Together, the carrier pads $48_3$ and $48_4$, the bonding wires $47_3$ and $47_4$, the chip pads $49_2$ and $49_3$ and chip connectors $39_{y1}$ and $39_{x1}$ (see FIG. 11) are core connectors for connecting the antenna to the secondary core 3 which is tag $24_4$ in FIG. 23.

In FIG. 23, antenna $4_{23a}$ is a chip antenna like the chip antenna $4_1$ of FIG. 1 and is an alternate embodiment that can be used in place of or in addition to the antenna $4_{23}$.

Figure 24:
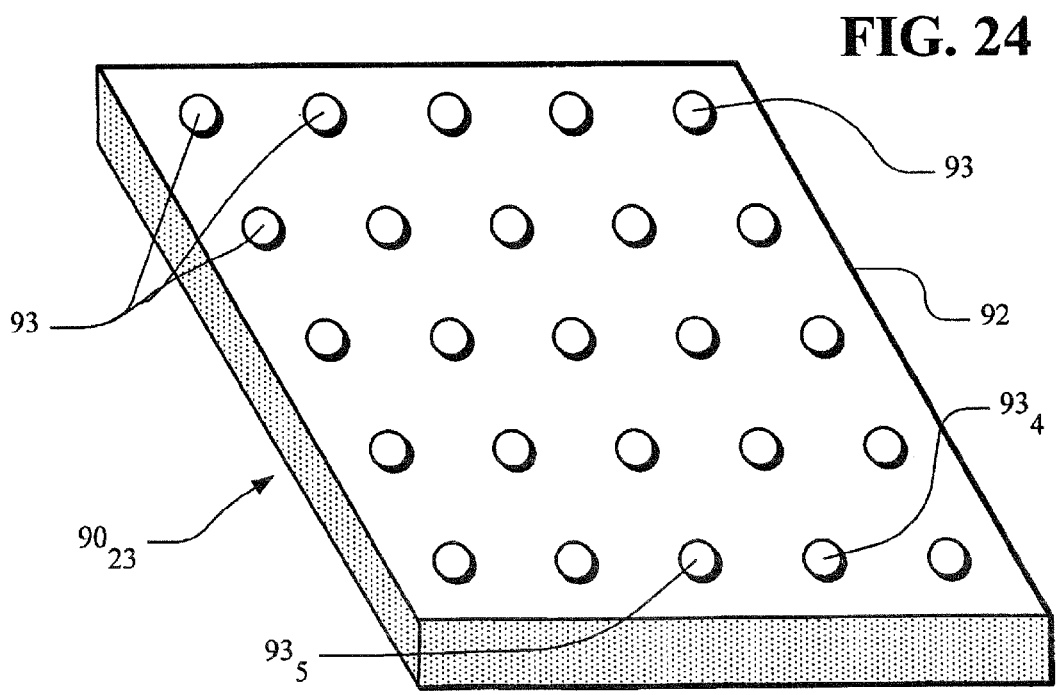
FIG. 24 depicts an isometric, bottom view of the finished package of FIG. 23.

FIG. 24 depicts an isometric, bottom view of the finished package $90_{23}$ of FIG. 23. The balls 93 connect with vias to the via pads 44 in FIG. 23. For example, the balls $93_4$ and $93_5$ of FIG. 24 connect to the via pads $44_4$ and $44_5$, respectively, of FIG. 23.

Figure 25:
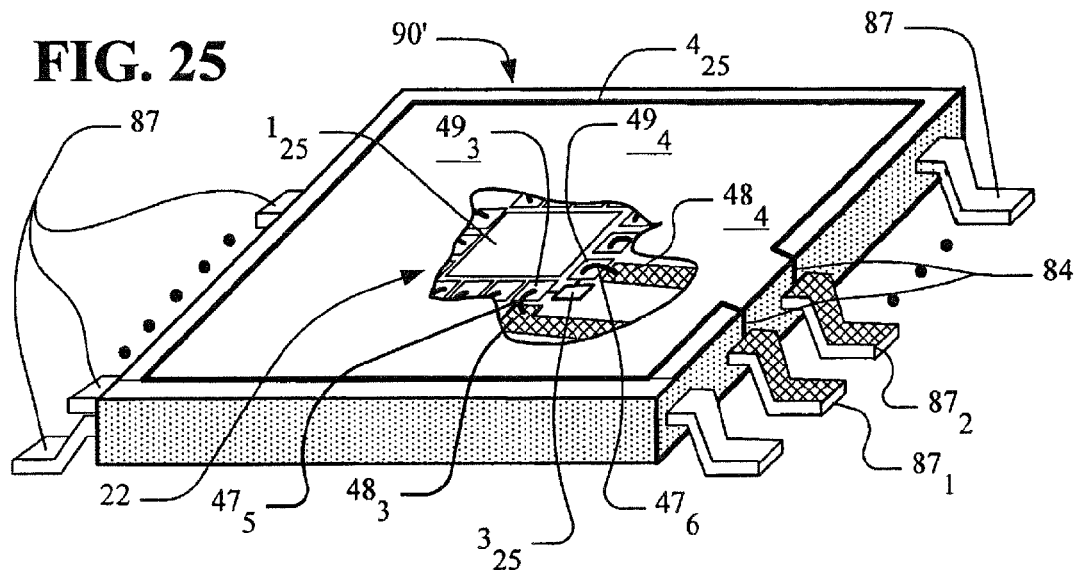
FIG. 25 depicts a schematic, isometric top view of an alternate chip carrier.

In FIG. 25, a schematic, isometric, partially-cutaway, top view of an alternate chip carrier 90' is shown. The chip carrier 90' includes a plurality of dual in-line package leads 87 that connect into the carrier 90' to make electrical contact with contact pads internal to the carrier 90'. The package leads $87_1$, $87_2$ and the other package leads 87 are positioned along the edges of chip carrier 90'. The package leads $87_1$, $87_2$ connect internally to carrier pads $48_3$ and $48_4$, respectively, in close proximity to an encapsulated chip. The chip 22 is partially revealed by the cutaway in the center of carrier 90'. The chip 22 includes a primary core 125 surrounded by chip pads of which chip pads $49_3$ and $49_4$ are typical. The carrier pads $48_3$ and $48_4$ are electrically connected to the chip pads $49_3$ and $49_4$, respectively, by bonding wires $47_5$ and $47_6$, respectively. The chip pads $49_3$ and $49_4$ are connected to the secondary core $3_{25}$ (RF core) for RF communication through the antenna $4_{25}$.

The loop antenna $4_{25}$ connects in a peripheral region around the top perimeter of the package 90' forming a loop between the package leads $87_1$ and $87_2$. The loop $4_{25}$ connects to the package leads $87_1$ and $87_2$ by the feed-lines 84 that are on the side of the carrier 90'. The cut-away portion of FIG. 25 reveals connection of package leads $87_1$ and $87_2$ to the carrier pads $48_3$ and $48_4$.

In the different embodiments, the core connectors for connecting the antenna to an RF core include many different conductors. All such conductors are individually or collectively defined as core connectors. For example, in connection with FIG. 25, the package leads $87_1$ and $87_2$, the feed-lines 84, the carrier pads $48_3$ and $48_4$, the bonding wires $47_5$ and $47_6$, the chip pads $49_3$ and $49_4$ are individually or collectively defined as core connectors for connecting the antenna $4_{25}$ to an RF secondary core $3_{25}$.

In FIG. 25, the packaged alternate chip carrier 90' has at least one semiconductor chip inside with the built-in antenna $4_{25}$ on the packaged part 90'. The rectangular loop shape of the antenna $4_{25}$ is shown by way of example. Any other shape such as circular, square, hexagonal and octagonal may be employed that can effectively receive and transmit electromagnetic signals. The loop antenna conductors on package parts are constructed, for example, by using silver paste or other conductive material together with printing techniques commonly used in printing Logos of product companies.

While FIG. 25 depicts a loop antenna, other types of antennas, such as dipole antennas and folded dipole antennas as previously described, can be readily employed. While FIG. 25 depicts the antenna on the outer surface of carrier 90', an alternate embodiment encapsulates antenna $4_{25}$ internally within the encapsulation material.

In FIG. 26, the stage communicator 40 (interrogator, reader, writer) communicates with RF tags 24. The stage communicator 40 includes an RF unit 43 for wireless communication with the RF tags 24. The RF unit 43 communicates with processor 42 over link 57. The stage communicator 40 communicates with RF tags 24, where the tags 24 are as described in connection with FIG. 14. The tags 24 have antennas $4_{26}$ that are, for example, any of the antennas 4 as described in connection with various of the figures of this specification. The processor 42 controls the transfer of information to and from the tags 24. The tags 24 respond to tag instructions that pass through the RF unit 43 and that are issued by the processor 42. Processor 42 stores and executes tag program routines that issue commands that write to, read from and otherwise access tags 24 where the routines typically use a Tag Instruction Set.

The processor 42 in some embodiments is logically integrated with the RF unit 43 as a single piece of equipment and in other embodiments the RF unit 43 and processor 42 are separated and are connected by a wired or wireless link 57. When separate, typically the connection between RF unit 43 and processor 42 operates according to a wireless WiFi 802.11 a/b/g standard, but any convenient communications link may be employed.

In FIG. 26, the local equipment 51 may be implemented in different ways. In one example, local processing equipment 52 includes automated equipment used in the processing steps performed at a stage. Since each stage in a chain of stages performs different functions, the processing equipment 52 differs from stage to stage to meet the needs of each particular stage. The processing equipment 52 in one embodiment connects over a link 54 to a router 53 to enable communication of the processing equipment throughout the system. The stage computer 47 is optional but typically is provided with conventional hardware elements such as local memory 82, displays, keyboards, interfaces and communications connections useful in controlling or otherwise cooperating with the processing equipment 52 over a link 59. The local memory 82 is available for storing copies of information stored in the tags 24. The computer 47 connects to processing equipment 52 via a link 59 and connects to a router 53 via link 58. The router 53 inter connects processor 42, network 46, stage computer 47 and process equipment 52. A connection link 44 connects the router 53 to the network 46 which connects to the management computer 41, including management memory 83. The network 46 typically includes a connection over the internet. The process equipment 52 optionally includes a direct link 56 to processor 42 to enable signaling to processor 42 of processing conditions that are useful for control or other operations.

In FIG. 26, the system architecture of the local equipment 51 may be of many forms apparent to those skilled in the art of system architecture. For example, all of the links 54, 55, 56 57, 58 and 59 may be wired or wireless according to conventional practices. When the connections are wireless, a wireless WiFi 802.11 a/b/g standard is typical, but any convenient communications link may be employed. FIG. 14 shows a functional block diagram of a typical RF tag 24.

Figure 27:
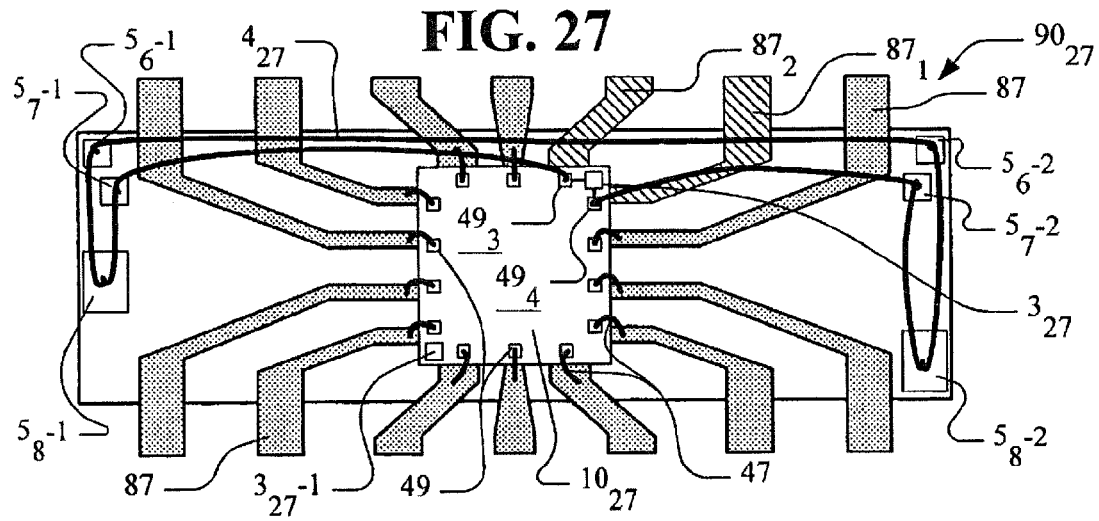
FIG. 27 depicts a top view of an alternate dual in line chip carrier with a dipole antenna.

In FIG. 27, a top view of an alternate chip carrier $90_{27}$ is shown. The chip carrier $90_{27}$ includes a plurality of dual in-line package leads 87 that connect into the carrier $90_{27}$ to make electrical contact with contact pads internal to the carrier $90_{27}$. The package leads $87_1$ and $87_2$ and the other package leads 87 are positioned along the edges of chip carrier $90_{27}$. The package leads 87 terminate in close proximity to a chip $10_{27}$. The chip $10_{27}$ includes chip pads 49 of which chip pads $49_3$ and $49_4$ are used for connection to antenna $4_{27}$. The ends of the package leads 87, other than package leads $87_1$ and $87_2$, are electrically connected to chip pads 49 by bonding wires 47. The chip pads $49_3$ and $49_4$ are connected to the secondary core $3_{27}$ (RF core) for RF communication using the antenna $4_{27}$. An alternate core $3_{27}$-1 is provided, but not used in the embodiment of FIG. 27. As described in connection with FIG. 11, for example, an additional antenna like antenna $4_{27}$ can be added to connect to alternate core $3_{27}$-1 for RF communication.

The antenna $4_{27}$ is a dipole antenna that is located in a peripheral region around a portion of the perimeter of chip carrier $90_{27}$ and above the plane of the chip carrier $90_{27}$. The plane of the chip carrier $90_{27}$ includes the package leads 87 and the chip $10_{27}$. The antenna $4_{27}$ is formed by one or more bonding wires and the bonding wire or wires connect in electrical series from chip pad $49_3$ to carrier pad $5_7$-1, to carrier pad $5_8$-1, to carrier pad $5_6$-1 to carrier pad $5_6$-2, to carrier pad $5_8$-2, to carrier pad $5_7$-2 and to chip pad $49_4$. The carrier pads 5, such as carrier pads $5_7$-1, $5_8$-1, $5_6$-1, $5_6$-2, $5_8$-2, $5_7$-2 in the peripheral region of carrier $90_{27}$ are identified as the "first carrier pads". The carrier pads 5 are located near the sides of the chip carrier $90_{27}$ so as to provide mechanical support points for the dipole antenna $4_{27}$. The antenna $4_{27}$ and the bonding wires extend above the plane of the chip and the carrier pads 5 and chip pads 49 so as not to contact any conductors below, except the carrier pads 5 (first carrier pads) to which the antenna bonding connections are made.

The chip pads $49_3$ and $49_4$ each electrically connects to the RF secondary core $3_{27}$. The pad $5_8$-1 and $5_8$-2 are tuning sections for modifying the reactance values of the dipole antenna $4_{27}$ for resonance and for tuning the electrical properties of the antenna.

Figure 28:
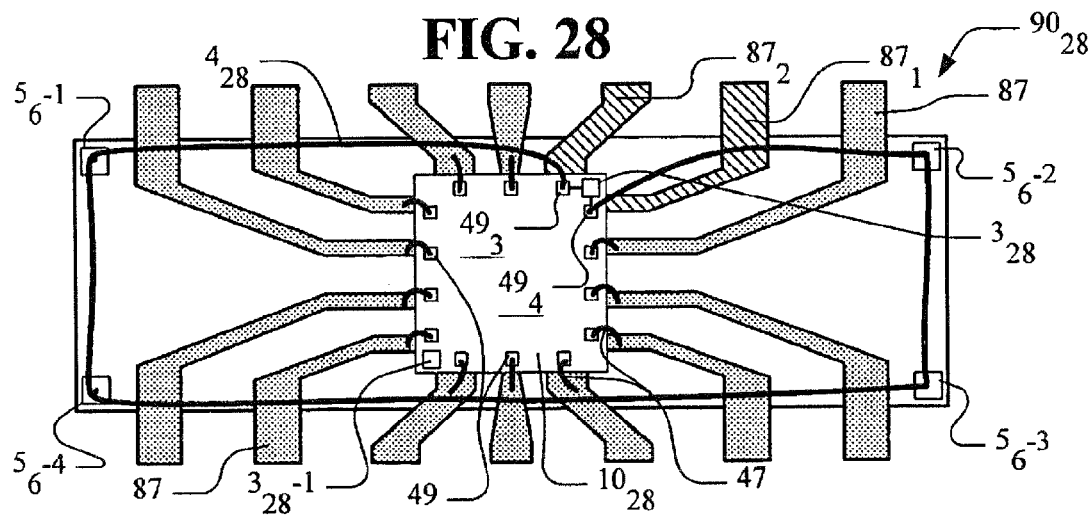
FIG. 28 depicts a top view of an alternate dual in line chip carrier with a loop antenna.

In FIG. 28, a top view of an alternate chip carrier $90_{28}$ is shown. The chip carrier $90_{28}$ includes a plurality of dual in-line package leads 87 that connect into the carrier $90_{28}$ to make electrical contact with contact pads internal to the carrier $90_{28}$. The package leads $87_1$ and $87_2$ and the other package leads 87 are positioned along the edges of chip carrier $90_{28}$. The package leads 87 terminate in close proximity to a chip $10_{28}$. The chip $10_{28}$ includes chip pads 49 of which chip pads $49_3$ and $49_4$ are used for connection to antenna $4_{28}$. The ends of the package leads 87, other than package leads $87_1$ and $87_2$, are electrically connected to chip pads 49 by bonding wires 47. The chip pads $49_3$ and $49_4$ are connected to the secondary core $3_{28}$ for RF communication together with the antenna $4_{28}$. An alternate core $3_{28}$-1 is provided, but not used in the embodiment of FIG. 28. As described in connection with FIG. 11, for example, an additional antenna like antenna $4_{28}$ can be added to connect to alternate core $3_{28}$-1 for RF communication.

The antenna $4_{28}$ is a loop antenna that is located in a peripheral region around the perimeter of chip carrier $90_{28}$ and above the plane of the chip carrier $90_{28}$. The plane of the chip carrier $90_{28}$ that includes the package leads 87 and the chip $10_{28}$. The antenna $4_{28}$ is formed by one or more bonding wires and the bonding wire or wires connect in electrical series from chip pad $49_3$ to carrier pad $5_6$-1, to carrier pad $5_6$-4, to carrier pad $5_6$-3, to carrier pad $5_6$-2 and to chip pad $49_4$. The carrier pads 5, such as carrier pads $5_7$-1, $5_8$-1, $5_6$-1, $5_6$-2, $5_8$-2, $5_7$-2 in the peripheral region of carrier $90_{27}$ are identified as the "first carrier pads". The carrier pads 5 are located near the corners of the chip carrier $90_{28}$ so as to provide mechanical support points for the loop antenna $4_{28}$. The antenna $4_{28}$ and the bonding wires extend above the plane of the chip $10_{28}$ and the carrier pads 5 (first carrier pads) and chip pads 49 so as not to contact any conductors below, except the carrier pads 5 to which the antenna bonding connections are made. The chip pads $49_3$ and $49_4$ each electrically connects to the RF secondary core $3_{28}$.

Figure 29:
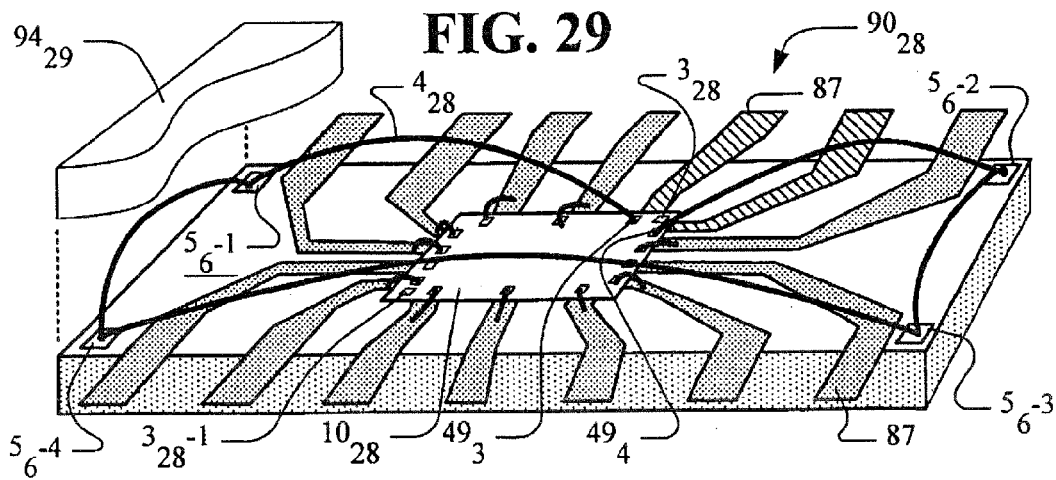
FIG. 29 depicts an isometric, top view of the carrier of FIG. 28.

In FIG. 29, an isometric view of an alternate chip carrier $90_{28}$ of FIG. 28 is shown. The chip carrier $90_{28}$ includes a plurality of dual in-line package leads 87 that connect into the carrier $90_{28}$ to make electrical contact with contact pads internal to the carrier $90_{28}$. The package leads $87_1$ and $87_2$ and the other package leads 87 are positioned along the edges of chip carrier $90_{27}$. The package leads 87 terminate in close proximity to a chip $10_{28}$. The chip $10_{28}$ includes chip pads 49 of which chip pads $49_3$ and $49_4$ are used for connection to antenna $4_{28}$. The ends of the package leads 87, other than package leads $87_1$ and $87_2$, are electrically connected to chip pads 49 by bonding wires 47. The chip pads $49_3$ and $49_4$ are connected to the secondary core $3_{28}$ for RF communication together with the antenna $4_{28}$.

The antenna $4_{28}$ is a loop antenna that is located in a peripheral region around the perimeter of chip carrier $90_{28}$ and above the plane of the chip carrier $90_{28}$. The plane of the chip carrier $90_{28}$ includes the package leads 87 and the chip $10_{28}$. The antenna $4_{28}$ is formed by one or more bonding wires and the bonding wire or wires connect in electrical series from chip pad $49_3$ to carrier pad $5_6$-1, to carrier pad $5_6$-4, to carrier pad $5_6$-3, to carrier pads $5_6$-2 and to chip pad $49_4$. The chip pads $49_3$ and $49_4$ each electrically connects to the RF secondary core $3_{28}$. The antenna $4_{28}$ and the bonding wires between carrier pads 5 (first carrier pads) extend above the plane of the chip $10_{28}$ and the carrier pads 5 and chip pads 49 so as not to contact any conductors below, except the carrier pads 5 to which the antenna bonding connections are made.

A portion of an insulating compound $94_{29}$ that encapsulates the chip carrier $90_{28}$ including the antenna $4_{28}$ is shown in exploded view above the antenna $4_{28}$ and above the other parts of the chip carrier $90_{28}$. When fully assembled, the insulating compound $94_{29}$ completely covers the chip and carrier pads $49_3$, $5_6$-1, $5_6$-4, $5_6$-3, $5_6$-2, pad $49_4$, the chip $10_{28}$ and the antenna $4_{28}$ and therefore the antenna $4_{28}$ and the other components are not exposed to moisture or other environmental conditions. The insulating compound $94_{29}$ is a good dielectric so as not to impair antenna performance.

Figure 30:
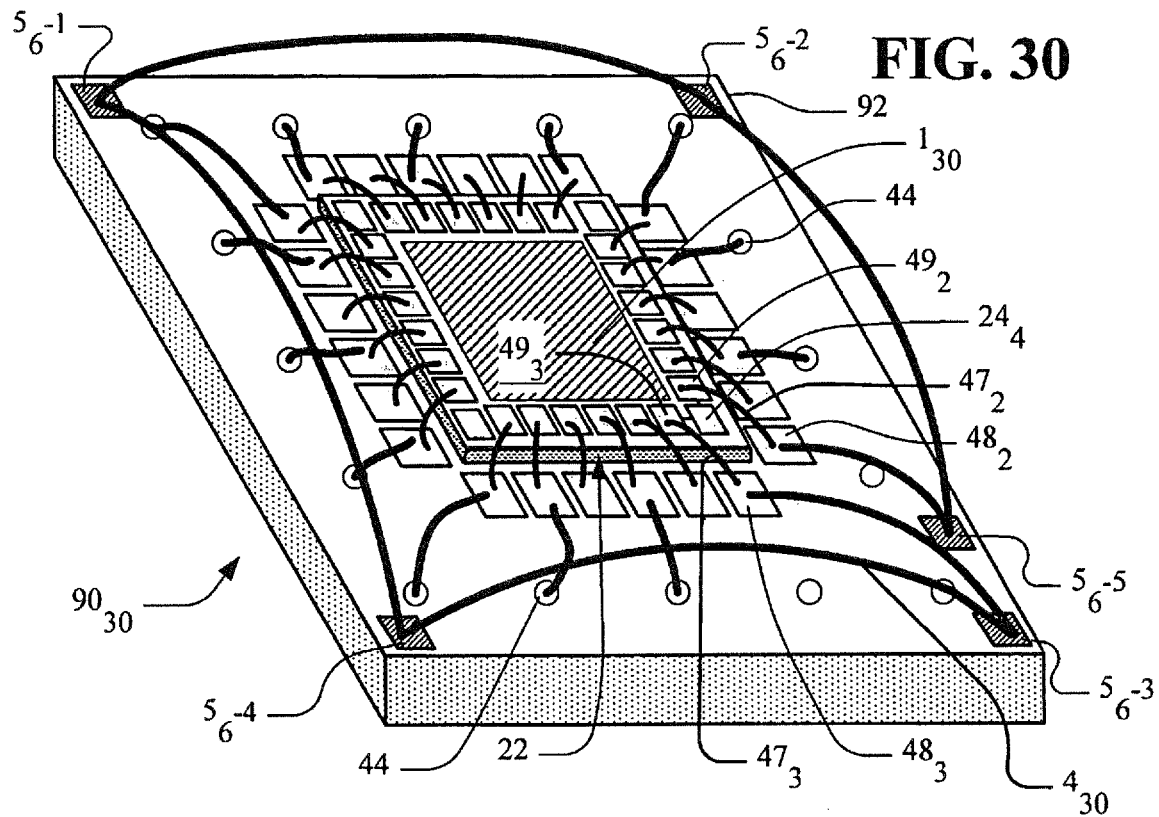
FIG. 30 depicts an isometric view of an alternate ball grid array with a loop antenna.

In FIG. 30, an isometric, top, view of a chip carrier $90_{30}$ for an alternate ball grid array similar to the one of FIG. 23 is shown. Some of the via pads 44 are located between the edge of base 92 and the base carrier pads 48, of which carrier pads $48_2$ and $48_3$ are typical. The loop antenna $4_{30}$ extends in a peripheral region around the perimeter of the base 92 and is formed by bonding wires that extend above the top plane of base 92 of chip carrier $90_{30}$. The top plane includes the top pf chip 22 and the top surface of the base 92. The antenna $4_{30}$ is formed by one or more bonding wires and the bonding wire or wires connect in electrical series from carrier pad $48_3$ to carrier pad $5_6$-3, to carrier pad $5_6$-4, to carrier pad $5_6$-1, to carrier pad $5_6$-2, to carrier pad $5_6$-5 and to carrier pad $48_2$. The carrier pads 5 including carrier pads $5_6$-3, $5_6$-4, $5_6$-1, $5_6$-2 and $5_6$-5 are located in the peripheral region of carrier $90_{30}$ and are identified as the "first carrier pads". The carrier pads 48, such as $48_2$ and $48_3$ are located in a region in close proximity to the chip pads 49 and are identified as "second carrier pads". The carrier pads $48_2$ and $48_3$ are connected with bonding wires $47_3$ and $47_4$, respectively, to the chip pads $49_2$ and $49_3$, respectively. The chip pads $49_2$ and $49_3$ each electrically connects to the RF secondary core $24_4$. The bonding wires of antenna $4_{30}$ extend above the plane of the carrier pads 5 and 48 and chip pads 49 and chip 22 so as not to electrically contact any conductors below, except the carrier pads 5 and 48 to which the antenna bonding connections are made.

The chip carrier $90_{30}$ typically also includes an insulating compound (not shown) for encapsulating the entire carrier, similar to the insulating compound 94 of FIG. 23. When fully assembled, the insulating compound completely covers the carrier pads $48_4$ $5_6$-3, $5_6$-4, $5_6$-1, $5_6$-2, $5_6$-5 and $48_3$ and the antenna $4_{30}$ and therefore the antenna $4_{30}$ and the other components are not exposed to moisture or other environmental conditions. The insulating compound is a good dielectric so as not to impair antenna performance.

Figure 31:
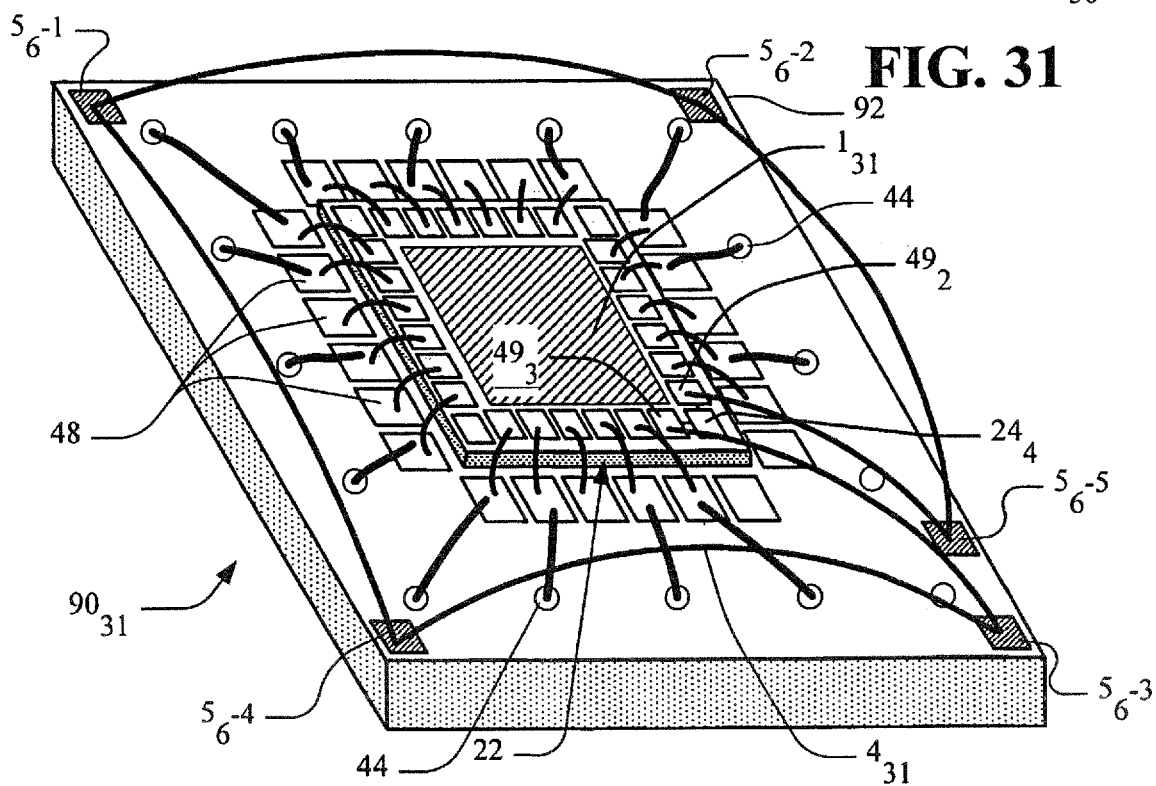
FIG. 31 depicts an isometric view of another alternate ball grid array with a loop antenna.

In FIG. 31, an isometric, top, view of a chip carrier $90_{31}$ for an alternate ball grid array similar to the one of FIG. 30 is shown. The via pads 44 are located between the edge of base 92 and the base carrier pads 48. The loop antenna $4_{31}$ extends in a peripheral region around the perimeter of the base 92 and is formed by bonding wires that extend above base 92. The bonding wires are above the plane of the chip carrier $90_{31}$. The plane of the chip carrier $90_{31}$ includes chip 22 and the top surface of the base 92. The antenna $4_{31}$ is formed by one or more bonding wires connected in electrical series from chip pad $49_3$ to carrier pad $5_6$-3, to carrier pad $5_6$-4, to carrier pad $5_6$-1, to carrier pad $5_6$-2, to carrier pad $5_6$-5 and to chip pad $49_2$. The carrier pads 5, such as carrier pads $5_6$-3, $5_6$-4, $5_6$-1, $5_6$-2 and $5_6$-5, in the peripheral region of carrier $90_{30}$ are identified as the "first carrier pads" The carrier pads 48 in a region in close proximity to the chip pads 49, are identified as "second carrier pads". The chip pads $49_2$ and $49_3$ each electrically connects to the RF secondary core $24_4$. The antenna $4_{31}$ and the bonding wires extend above the plane of the chip 22 and pads 5 and 49 and chip 22 so as not to contact any conductors below, except the carrier pads 5 and chip pads 49 to which the antenna bonding connections are made.

The chip carrier $90_{31}$ typically also includes an insulating compound (not shown) for encapsulating the entire carrier, similar to the insulating compound 94 of FIG. 23. When fully assembled, the insulating compound completely covers the carrier pads 5 and 48 and the antenna $4_{31}$ and therefore the antenna $4_{31}$ and the other components are not exposed to moisture or other environmental conditions. The insulating compound is a good dielectric so as not to impair antenna performance.

Figure 32:
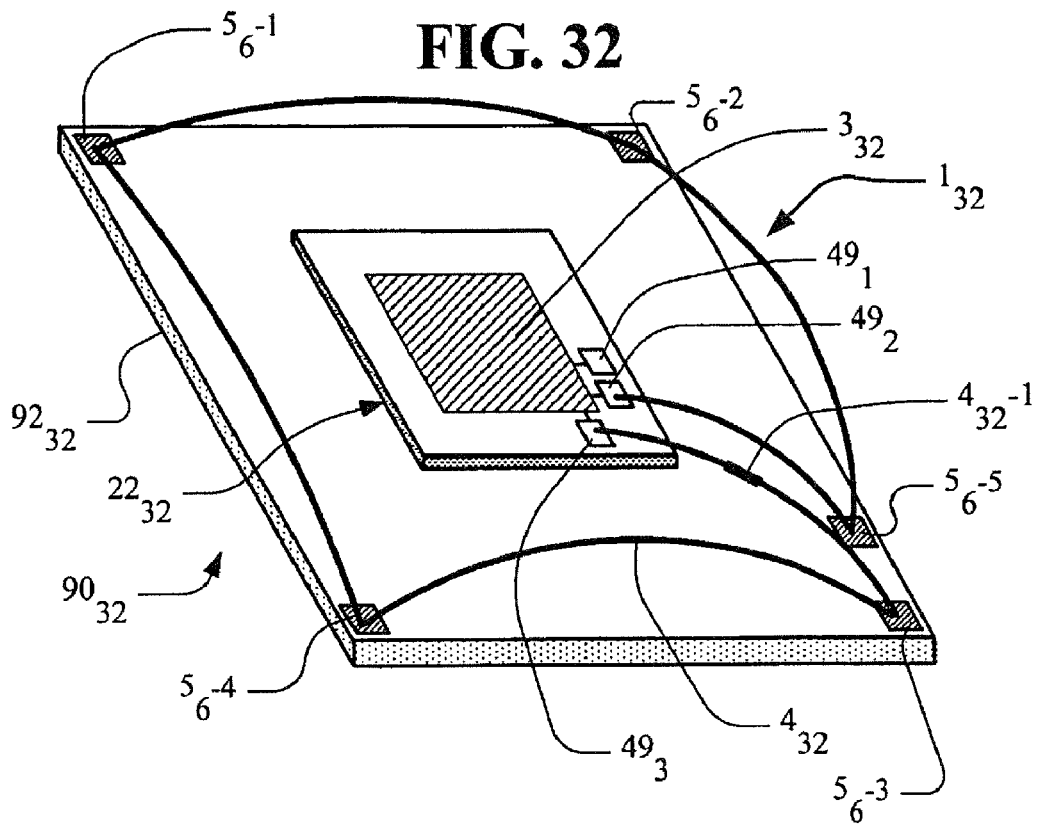
FIG. 32 is an isometric, top view of a simplified chip carrier structure dedicated to an RF function.

FIG. 32 is an isometric, top view of a simplified chip carrier structure $92_{32}$. The structure $92_{32}$ is dedicated to an RF function. The structure $92_{32}$ has a semiconductor chip $22_{32}$, including the RF core $3_{32}$, forming part of an RF element $1_{32}$. The RF core $3_{32}$ occupies a central region of the structure $92_{32}$. A plurality of chip pads $49_1$, $49_2$ and $49_3$ are on the chip $22_{32}$ and are electrically connected to the RF core $3_{32}$. The chip carrier $92_{32}$ includes a plurality of carrier pads 5, including carrier pads $5_6$-3, $5_6$-4, $5_6$-1, $5_6$-2 and $5_6$-5, in the peripheral region of carrier $90_{32}$. The antenna $4_{32}$ is formed by one or more bonding wires connected in electrical series from chip pad $49_3$ to carrier pad $5_6$-3, to carrier pad $5_6$-4, to carrier pad $5_6$-1, to carrier pad $5_6$-2, to carrier pad $5_6$-5 and to chip pad $49_2$. The antenna $4_{32}$ is connected to the carrier pads 5 and is connected to two of the chip pads, chip pads $49_2$ and $49_3$, for electrical connection to the RF core $3_{32}$. The loop antenna $4_{32}$ extends in a peripheral region around the perimeter of the base $92_{32}$ and is formed by bonding wires that extend above base $92_{32}$. The antenna $4_{32}$ and the bonding wires extend above the plane of the chip $22_{32}$ and pads 5 so as not to contact any conductors below, except the carrier pads 5 and chip pads 49 to which the antenna bonding connections are made.

The bonding wires of antenna $4_{32}$ may be optionally precoated with an insulating coating (for example, a film having a good electrical insulating property) to avoid having the bonding wires undesirably shorted to any conductors or shorted between themselves. The short insulating section $4_{32}$-1 on the section of antenna $4_{32}$ between pads $49_3$ and $5_6$-3 represents the principle of an insulating coating. In a typical embodiment, the insulating section $4_{32}$-1 extends over the entire length of the antenna from pad $49_3$ to pad $5_6$-3 and similarly an insulating coating extends over each of the other sections of antenna $4_{32}$. The insulating coating on the bonding wires is broken through during processing in regions where bonding connections are needed (such as bonding connections to pads 49). The break-through of the insulating coating is achieved by acoustic wave and/or localized heat treatments from a bonding tip of bonding equipment during the wire bonding process. In this way, good electrical connection is made between antenna $4_{32}$ and chip pads 49. The insulating coating on bonding wires in other regions (such as regions where the antenna contacts carrier pads 5) can be optionally made using the same break-through techniques. Since the insulating coating on a wire is a good insulator, the coating does not impair antenna performance.

In FIG. 32, the chip carrier $90_{32}$ typically also includes an insulating compound (not shown) for encapsulating the entire carrier, similar to the insulating compound 94 of FIG. 23. When fully assembled, the insulating compound completely covers the chip $22_{32}$, the carrier pads 5 and the antenna $4_{32}$ and therefore the antenna $4_{32}$ and the other components are not exposed to moisture or other environmental conditions. The insulating compound is a good dielectric so as not to impair antenna performance.

Figure 33:
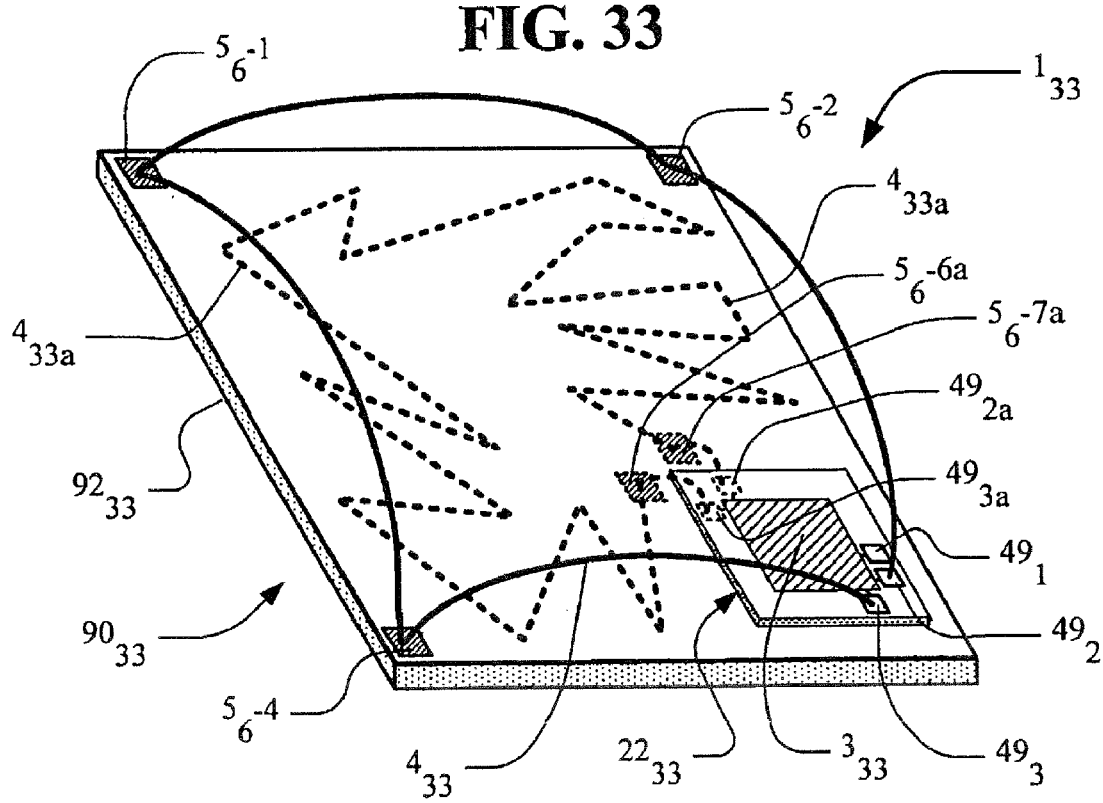
FIG. 33 is an isometric, top view of another simplified chip carrier structure dedicated to an RF function.

FIG. 33 is an isometric, top view of another simplified chip carrier structure $92_{33}$. The structure $92_{33}$ is dedicated to an RF function. The structure $92_{33}$ has a semiconductor chip $22_{33}$, including the RF core $3_{33}$, forming part of an RF element $1_{33}$. The RF core $3_{33}$ occupies a corner region of the structure $92_{33}$. A plurality of chip pads $49_1$, $49_2$ and $49_3$ are on the chip $22_{33}$ and are electrically connected to the RF core $3_{33}$. The chip carrier $92_{33}$ includes a plurality of carrier pads 5, including carrier pads $5_6$-4, $5_6$-1 and $5_6$-2 in the peripheral region of carrier $90_{33}$. The antenna $4_{33}$ is formed by one or more bonding wires connected in electrical series from chip pad $49_3$ to carrier pad $5_6$-4, to carrier pad $5_6$-1, to carrier pad $5_6$-2 and to chip pad $49_2$. The antenna $4_{33}$ is connected to the carrier pads 5 and is connected to two of the chip pads, chip pads $49_1$ and $49_2$, for electrical connection to the RF core $3_{33}$. The loop antenna $4_{33}$ extends in a peripheral region around the perimeter of the base $92_{33}$ and is formed by bonding wires that extend above base $92_{33}$. The antenna $4_{33}$ and the bonding wires extend above the plane of the chip $22_{33}$ and pads 5 so as not to contact any conductors below, except the carrier pads 5 and chip pads 49 to which the antenna bonding connections are made. While the example in FIG. 33 is illustrated for an antenna having one turn, generally antennas having more turns can be readily realized by adding additional carrier pads, preferably around the periphery of the carrier structure $92_{33}$. Adding additional pads 5 around the periphery further provides more control on routing the antenna $4_{33}$ for better antenna performance. The bonding wires of antenna $4_{33}$ can be optionally coated with an insulating layer and if coated can be optionally processed with break-through techniques as described in connection with FIG. 32 in regions where electrical connections are made.

While the embodiment described in FIG. 33 is for a loop antenna, any type of antenna may be employed. As one alternate embodiment, the meander line antenna $4_{33a}$ connects from chip pads $49_{2a}$ and $49_{3a}$, to carrier pads $5_6$-$6a$ and $5_6$-$7a$. The antenna $4_{33a}$ meanders from carrier pad $5_6$-$6a$ to carrier pad $5_6$-$7a$ in an irregular pattern. The electrical length of the meander line antenna $4_{33a}$ is up to $\lambda$ or greater for radiation frequencies of 900 M Hz more or less.

The chip carrier $90_{33}$ typically also includes an insulating compound (not shown) for encapsulating the entire carrier, similar to the insulating compound 94 of FIG. 23. When fully assembled, the insulating compound completely covers the chip $22_{33}$, the carrier pads 5 and the antenna $4_{33}$ and therefore the antenna $4_{33}$ and the other components are not exposed to moisture or other environmental conditions. The insulating compound is a good dielectric so as not to impair antenna performance.

While a loop antenna is used in illustrations of FIGS. 32 and 33, antennas of other types (for example, dipole antennas, folded dipole antennas and other antennas) can be readily realized by proper arranging the carrier pads 5 and bonding wires without deviating from the scope of the present invention.

Each of the packages having a semiconductor carrier as described in various embodiments can have different shapes and sizes to accommodate the chip functions and the type of packaging employed including dual-in-line, ball grid array and other packaging. In general, and by way of example, the base materials for carriers are plastic, ceramic, paper or any other good insulator that has good insulating properties and can provide mechanical support to the chip. The typical dimensions for the base of a carrier are in the range of from 1 cm to 10 cm per side and bases typically have a square shape or a rectangular shape.

The antennas described in various embodiments have all utilized materials of high conductivity and have been formed using conventional techniques well known in the semiconductor industry. Conventional forming techniques include bonding wire techniques installed using wire bonding machines and printing techniques of all types including optical, contact and other printing processes. The bonding wire techniques, for example, typically use metals such as aluminum (Al), gold (Au), silver (Ag), copper (Cu), iron (Fe), nickel (Ni), platinum (Pt), tantalum (Ta), and alloys thereof, such as Ni and Fe alloys, Au and Pt alloys. High conductivity materials for antennas help to reduce the ohmic resistance of the antenna relative to the radiation resistance of the antenna and hence help to promote good antenna performance.

Various embodiments of the invention have been described using loop or dipole antennas, but those embodiments are only representative and other embodiments can also utilize any of the small antennas described or any other small antenna that fits within the geometry of a chip, a chip carrier or other packaging.

In the various embodiments of the invention, contact pads are employed for making electrical connections and those pads are defined with different terms. For example, in FIG. 1, the connection elements $1_1$, $1_2$, $1_3$ and $1_4$ are contact pads utilized to make electrical connections. For example, in FIG. 11, the die pads (also termed "chip pads") 49 are contact pads utilized to make electrical connections. For example, in FIG. 18, FIG. 20, FIG. 23 and FIG. 25 the carrier pads 48 and the chip pads 49 are contact pads utilized to make electrical connections.

In the various embodiments of the invention, package connectors for making electrical connections to packages have been defined with different terms. For example, in connection with FIG. 18, FIG. 19, FIG. 20 and FIG. 24, the package connectors have been referred to as balls 93. For example, in connection with FIG. 25, the package connectors have been referred to as package leads 87.

In some embodiments described, the antennas on package parts are not encapsulated and remain exposed so that the packing material will not impair antenna performance. In alternate embodiments where protection from moisture or other environmental hazards is desirable, the antenna is encapsulated in the packaging material. In such encapsulated embodiments, the encapsulation does not interfere with good RF signal reception and transmission when the packaging material is a good insulator. The RF conduction through a good insulator can be understood from the theory relating to skin-depth (penetration depth) of electro-magnetic waves as described below:

The penetration depth, $\delta$, of an electro-magnetic wave penetrating a good insulator can be expressed in the following equation, $$\delta = (2/\omega\mu\sigma)^{1/2}$$

where:
$\omega$=radian frequency=$2\pi f$ (cycles/second)
$\mu$=magnetic permeability (henrys/meter)
$\sigma$=conductivity (mhos/meter);

In a good insulator, where the value of $\sigma$ is very low and approaches zero, the value of $\mu$ is very high and approaches infinity. Generally, for a packing material made from a good insulator, $\delta$ is much larger than the thickness of the packaging material. Therefore, the electromagnetic waves carrying the RF communication signals penetrate the packaging material to interact with the antenna in the same strength as if the antenna were not encapsulated.

While the invention has been particularly shown and described with reference to preferred embodiments thereof it will be understood by those skilled in the art that various changes in form and details may be made therein without departing from the scope of the invention.

The invention claimed is:

1. A structure comprising:
   a semiconductor chip comprising:
   a communication element being formed in or on a region of said semiconductor chip, said communication element having a communication core for performing a wireless communication function;
   a plurality of chip pads with two of said chip pads electrically connected to said communication core;
   a chip carrier for carrying said semiconductor chip, said chip carrier including a plurality of carrier pads with two of said carrier pads connected to said two of said chip pads; and
   an antenna connected to at least one of said carrier pads and at least one of said chip pads and electrically connected to said communication core.

2. The structure of claim 1, wherein said carrier pads include first carrier pads located in a peripheral region of said chip carrier and wherein said antenna is formed of a wire bonded to and connecting between said first carrier pads and wherein said wire extends above a plane including said first carrier pads and said semiconductor chip.

3. The structure of claim 2, wherein said first carrier pads are located near corners of said chip carrier and said antenna comprises a loop antenna.

4. The structure of claim 2, wherein said first carrier pads are located near sides of said chip carrier and said antenna is a dipole antenna.

5. The structure of claim 2, wherein said chip carrier comprises a ball grid array.

6. The structure of claim 2, wherein said chip carrier includes an encapsulating material and where said semiconductor chip and said antenna are encapsulated in said encapsulating material.

7. The structure of claim 2, wherein said chip carrier includes a plurality of second carrier pads located in proximity to said semiconductor chip and wherein said antenna is formed of a wire bonded to and connecting between said first carrier pads, said wire extending in electrical series from said first carrier pads to said second carrier pads and to said chip pads for electrical connection to said communication core.

8. The structure of claim 7, wherein said antenna wire is bonded to and connects between said first carrier pads and wherein said wire extends above a plane including said first carrier pads and said semiconductor chip.

9. The structure of claim 8, wherein said first carrier pads are located near corners of said chip carrier and said antenna is a loop antenna.

10. The structure of claim 8, wherein said first carrier pads are located near sides of said chip carrier and said antenna is a dipole antenna.

11. The structure of claim 8, wherein said chip carrier is a ball grid array.

12. The structure of claim 1, wherein said chip carrier includes an encapsulating material and where said semiconductor chip and said antenna are encapsulated in said encapsulating material.

13. The structure of claim 1, wherein said communication element comprises an RF element.

14. The structure of claim 13, wherein said RF element operates at an RF frequency having a wavelength of approximately $\lambda$ and wherein said antenna has an electrical length in a range of approximately $\lambda/16$ to $\lambda$.

15. The structure of claim 1, wherein said antenna is formed of a wire bonded to said pads and wherein said wire includes an insulating coating.

16. The structure of claim 1, wherein said antenna is metal from the group consisting of aluminum (Al), gold (Au), silver (Ag), copper (Cu), iron (Fe), nickel (Ni), platinum (Pt), tantalum (Ta) and alloys thereof.

17. The structure of claim 1, wherein said chip carrier includes an insulating base formed of plastic, ceramic or paper.

18. The structure of claim 1, wherein said antenna has a frequency limit of 1 GHz.

19. The structure of claim 1, wherein the communication element comprises a semiconductor communication element attached to a top surface of said semiconductor chip.

20. The structure of claim 1, wherein the communication element comprises a semiconductor communication element fabricated with said semiconductor chip, said semiconductor chip being formed by native processing steps and said semiconductor communication element being formed by said native processing steps.

* * * * *